US007242211B2

(12) United States Patent
Whetsel

(10) Patent No.: US 7,242,211 B2
(45) Date of Patent: Jul. 10, 2007

(54) HIERARCHICAL LINK INSTRUCTION REGISTER CORE/EMBEDDED CORE WRAPPER ENABLE SIGNALS

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 31 days.

(21) Appl. No.: 11/096,399

(22) Filed: Apr. 1, 2005

(65) Prior Publication Data
US 2005/0204236 A1 Sep. 15, 2005

Related U.S. Application Data

(62) Division of application No. 10/028,326, filed on Dec. 21, 2001, now Pat. No. 6,877,122.

(60) Provisional application No. 60/257,790, filed on Dec. 22, 2000.

(51) Int. Cl.
*G01R 31/26* (2006.01)
(52) U.S. Cl. .................. 324/765; 714/733; 714/734

(58) Field of Classification Search ............... None
See application file for complete search history.

(56) References Cited

U.S. PATENT DOCUMENTS

| 4,564,943 | A | * | 1/1986 | Collins et al. ............... 714/745 |
| 5,285,453 | A | * | 2/1994 | Gruodis ..................... 714/726 |
| 5,381,420 | A | * | 1/1995 | Henry ........................ 714/731 |
| 5,889,788 | A | * | 3/1999 | Pressly et al. .............. 714/726 |

* cited by examiner

*Primary Examiner*—Ha Tran Nguyen
*Assistant Examiner*—Richard Isla-Rodas
(74) *Attorney, Agent, or Firm*—Lawrence J. Bassuk; W. James Brady; Frederick J. Telecky, Jr.

(57) ABSTRACT

A test architecture accesses IP core test wrappers within an IC using a Link Instruction Register (LIR). An IEEE P1500 standard is in development for providing test access to these individual cores via a test structure called a wrapper. The wrapper resides at the boundary of the core and provides a way to test the core and the interconnections between cores. The test architecture enables each of the plural wrappers in the IC, including wrappers in cores embedded within other cores, with separate enable signals.

8 Claims, 16 Drawing Sheets

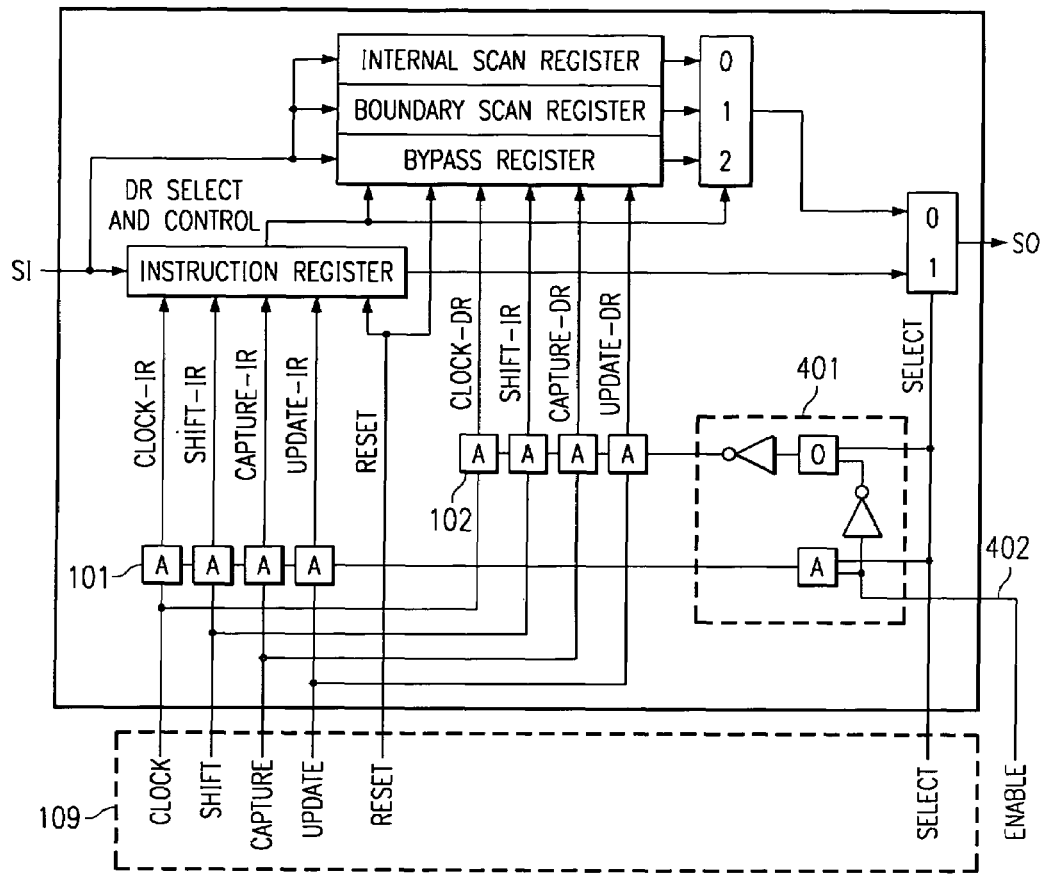
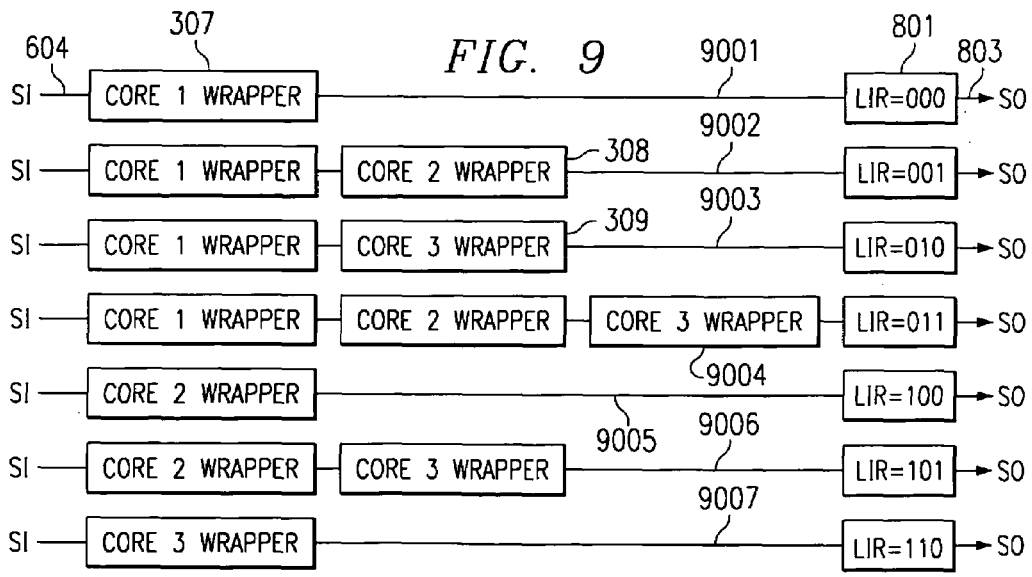

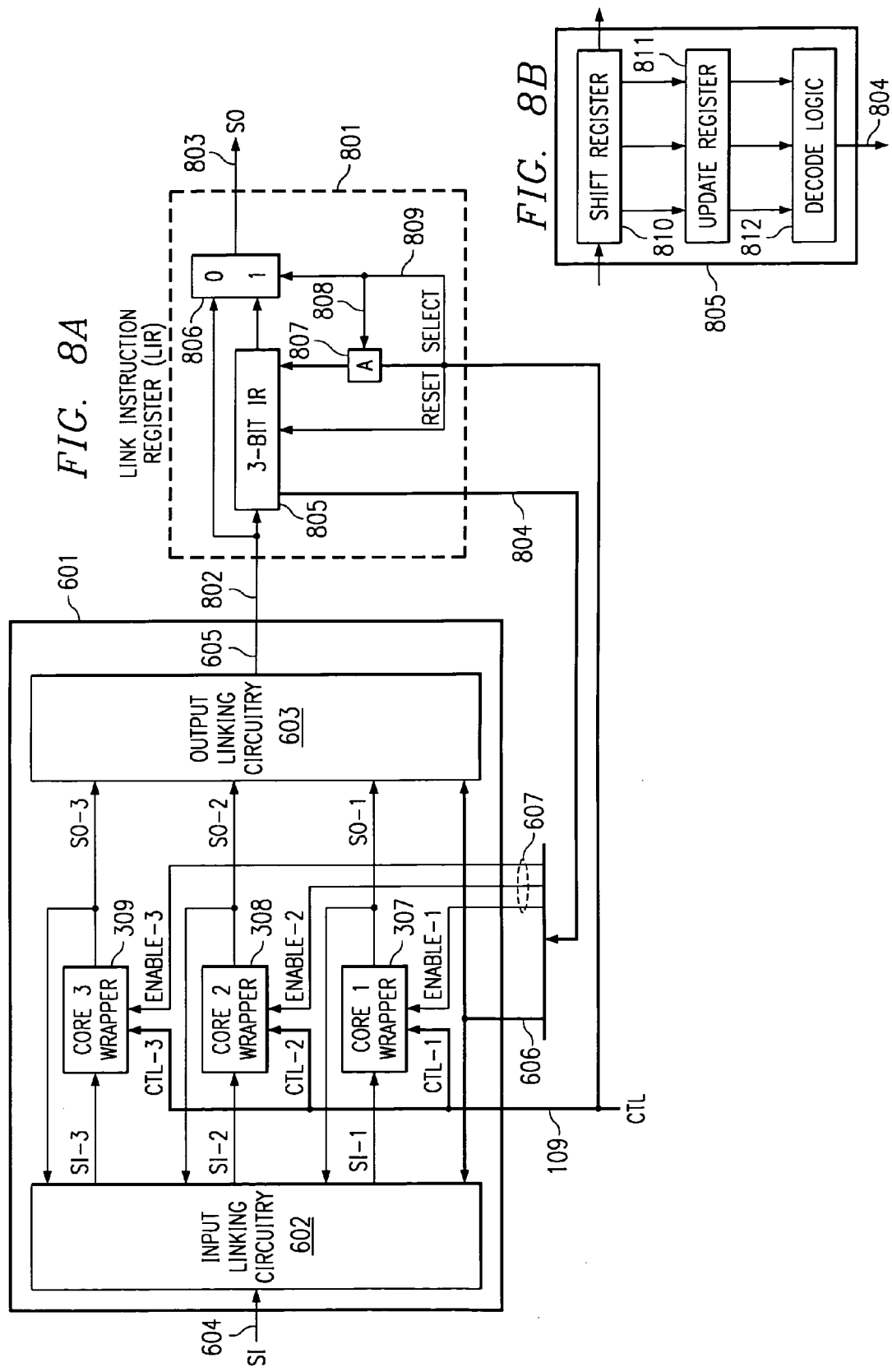

HIERARCHICAL LINK INSTRUCTION REGISTER CORE/EMBEDDED CORE WRAPPER ENABLE SIGNALS

CROSS REFERENCE TO RELATED APPLICATIONS

This application is a divisional of prior patent application Ser. No. 10/028,326, filed Dec. 21, 2001, now, U.S. Pat. No. 6,877,122, issued Apr. 5, 2005; which claims priority under 35 USC 119(e) (1) of provisional application Ser. No. 60/257,790, filed Dec. 22, 2000.

This patent is related to and incorporates by reference patent application Ser. No. 09/864,509 filed May 24, 2001, titled: 1149.1 Tap Linking Modules, now U.S. Pat. No. 7,058,862, issued Jun. 6, 2006.

BACKGROUND OF THE DISCLOSURE

1. Field of the Disclosure

This disclosure relates generally to testing intellectual property (IP) cores via a test structure called a wrapper. The wrapper resides at the boundary of a core and provides a way to test the core and interconnections between the cores. Particularly, the disclosure relates to a test architecture for accessing wrappers within an integrated circuit.

2. Description of the Related Art

FIG. 1 illustrates the test structure of a prior art wrapper 100. The wrapper includes test interface signals 109, an instruction register 105, and set of data registers 106–108. The instruction register is a register accessed by the test interface signals to load test instructions that control the operation of the wrapper, in particular the instructions control the selection of a data register and control the mode of operation of the selected data register. The selected data register may be accessed by the test interface to shift test data in and out of the wrapper. The set of data registers shown in FIG. 1 includes; (1) an internal scan register 108 for testing the core circuitry, (2) a boundary scan register 107 for controlling the inputs and outputs of the core during testing, and (3) a bypass register 106 for bypassing the wrapper via a single bit. Any number of additional user defined data registers may be included in the set of data registers of the wrapper, such as data registers supporting core emulation and programming operations as described in the referenced patent application Ser. No. 09/864,509.

The test interface 109 includes; (1) a clock signal for timing wrapper shift and test operations, (2) a shift signal for enabling data to be shifted through the wrapper from the serial input (SI) to the serial output (SO), (3) a capture signal for causing data to be captured into the instruction register or a selected data register, (4) an update signal for causing data to be output from the instruction register or a selected data register, (5) a reset signal for initializing the wrapper's instruction and data registers, and (6) a select signal for selecting data to be shifted through either the instruction register from SI to SO, or through a selected data register from SI to SO.

In the example of FIG. 1, the test interface signals are simply gated, via AND gates (A), by the select signal to either allow them to be coupled to the instruction register or to the data registers. Other coupling methods may be used, but gating is used in this example. As can be seen, when select is high, gates 101 couple the test interface signals to the instruction register and the serial output of the instruction register is coupled to SO via multiplexer 103. In this configuration, the instruction register may be shifted via SI and SO for instruction loading/unloading. When select is low, gates 102 couple the test interface signals to the data registers and the serial output of the selected data register, as determined by the instruction loaded in the instruction register, is coupled to SO via multiplexers 104 and 103. In this configuration, the selected data register may be shifted via SI and SO for data loading/unloading.

As one skilled in the art of testing will see, the IEEE P1500 wrapper architecture is similar to the IEEE 1149.1 boundary scan architecture. The main difference between the P1500 wrapper architecture and 1149.1 boundary scan architecture is that the P1500 wrapper architecture accesses the instruction and data registers using discrete test interface signals 109 rather than accessing the instruction and data registers using the 1149.1's test access port (TAP) state machine interface. Thus P1500 wrappers are free of 1149.1 TAP interfaces.

FIG. 2 illustrates a core 201 equipped with the wrapper 100 of FIG. 1. The test interface signals 109 of FIG. 2 are indicated as Control (CTL), and SI and SO are indicated as labeled in FIG. 1. As the name implies the wrapper simply wraps around the core to provide a test access mechanism local to the core's input/output boundary. The instruction register 105, bypass register 106, and boundary register 107 are part of the wrapper. The internal scan register 108 is part of the core circuitry that may be accessed via the wrapper for testing the core.

FIG. 3 illustrates a prior art method of connecting three individual wrappers 307–309 of cores 1–3 onto a single scan chain arrangement 301. The wrapper arrangement 301 will exist inside an IC. The serial inputs of the wrappers 307–309 are indicated as SI-1, SI-2, SI-3. The serial outputs of the wrappers 307–309 are indicated as SO-1-, SO-2, and SO-3. The test interface signals 109 are bussed to the CTL-1, CTL-2, and CTL-3 inputs of wrappers 307–309. As seen in FIG. 3, the arrangement 301 scan chain passes serially through the wrappers 307–309 from SI 302 to SO 303. In this arrangement, all wrappers 307–309 can be controlled to load instructions via the SI 302 and SO 303 scan path, or all wrappers 307–309 can be controlled to load data via the SI 302 and SO 303 scan path. Access to the SI 302, SO 303, and test interface signals 109 of the arrangement 301 is typically provided to tester external of the IC.

FIG. 4 illustrates the wrapper design of FIG. 1 being modified to include an enable/disable capability. The modification includes adding an enable signal 402 and adding circuitry 401 (i.e. the OR (O) gate, AND (A) gate, and an inverter), responsive to the enable signal 402 to cause the wrapper to either be enabled to respond to the test interface 109 or be disabled from responding to the test interface 109. In this example, a low on enable 402 will disable the wrapper from responding to the test interface 109 and a high on enable 402 will enable the wrapper to respond to the test interface 109.

FIG. 5 illustrates an alternate method of enabling/disabling wrappers. In this example, it is assumed the wrapper design is fixed (hard) and cannot be modified, as could the wrapper design of FIG. 4. With a fixed wrapper design, the enabling/disabling capability must be external of the wrapper. In FIG. 5, gating circuitry 501 is inserted into the test interface 109 signal path to the wrapper and an enable signal 502 is added and connected to the gating circuitry to either enable the test interface signals 109 to be input to the wrapper or disable the test interface signals 109 from being input to the wrapper. In this example, a low on enable 502 will disable the wrapper from receiving the test interface signals and a high on enable 502 will enable the wrapper to receive the test interface signals. The use of wrapper enable signals, while not necessarily as shown in the examples of FIGS. 4 and 5, is known.

The IEEE P1500 standard will define the connections to a wrapper test structure for an individual core of an IC. The standard leaves open the interconnection of the wrappers around multiple cores and the interconnection of wrappers around hierarchically arranged cores within cores.

SUMMARY OF THE DISCLOSURE

In accordance with the disclosure, the serial data paths into and out of the IC and into and out of the wrappers are selectively connected through input linking circuitry and output linking circuitry. The input linking circuitry and output linking circuitry provide for selective serial connection of any one, plural, or all of the wrappers on the IC between the serial data input and serial data output.

In a hierarchical arrangement of cores and their wrappers, the input and output linking circuitry provide for selective connection of the highest-level wrapper to be included in the selective serial connection. Additionally, the input and output linking circuitry provide for the selective connection of any one, plural or all of the lower level wrappers to be included in the serial connection.

The disclosed circuits provide for the selective connection of the wrappers through use of control signals output from link instruction registers. The link instruction registers produce these control output signals in response to instructions that are shifted into the link instruction registers. The link instruction registers also include a bypass path so they do not affect the shifting of test data through the serial connection of the wrappers.

In a hierarchical arrangement of wrappers on an IC, a single enable signal line may be available external of the IC for controlling the selective connection of the wrappers with a minimum number of control lines.

BRIEF DESCRIPTION OF DRAWINGS

FIG. 4 illustrates a wrapper with an internal enable circuit.

FIG. 8A illustrates the FIG. 6A test architecture coupled to a Link Instruction Register (LIR) according to the disclosure.

FIG. 8B illustrates a 3-bit Instruction Register of the LIR.

FIG. 9 illustrates wrapper and LIR arrangements for the FIG. 8A test architecture.

DETAILED DESCRIPTION

The circuits and processes disclosed in this patent are used in manufacturing to test and ensure proper operation of the integrated circuit products before sale. The circuits and processes disclosed in this patent can also be used after the sale of the integrated circuit products to test and ensure the continued proper operation of the integrated circuit products and possibly to develop and test software products associated with the integrated circuit products.

Figure 3:
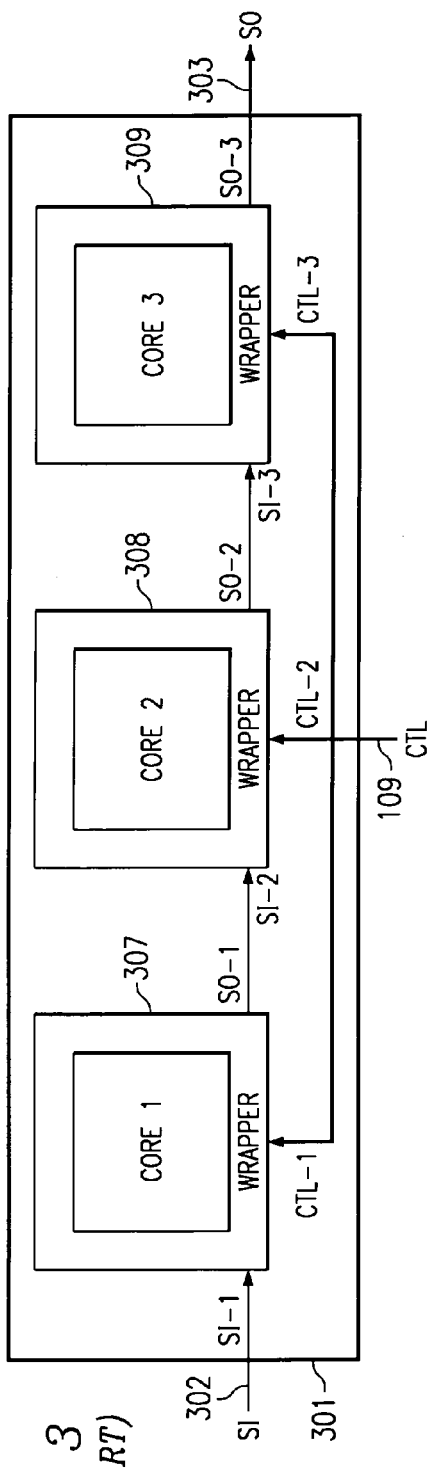
FIG. 3 illustrates a serial connection of three known wrappers.
Figure 6A:
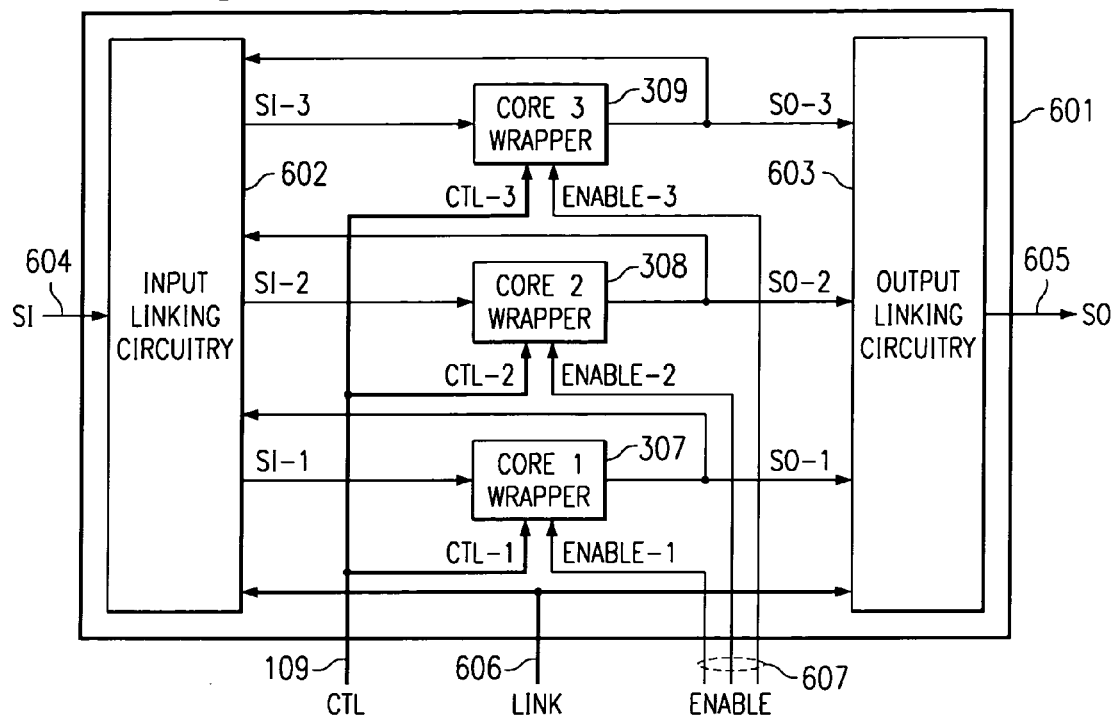
FIG. 6A illustrates a test architecture according to the disclosure.

FIG. 6A illustrates a preferred test architecture 601 for accessing the wrappers 307–308 of FIG. 3, according to the present disclosure. In the test architecture 601, wrappers 307–309 have been positioned between an input linking circuitry 602 block and an output linking circuitry 603 block, such that the wrapper serial inputs (SI-1, SI-2, SI-3) are output from the input linking circuitry 602 and the wrapper serial outputs (SO-1, SO-2, SO-3) are input to the output linking circuitry 603. The wrapper serial outputs (SO-1, SO-2, SO-3) are also input to the input linking circuitry 602. The input linking circuitry 602 receives a serial input SI 604 and the output linking circuitry 603 outputs a serial output 605. The control inputs (CTL-1, CTL-2, CTL-3) of wrappers 307–309 are commonly connected to test interface CTL bus 109. The input and output linking circuitry 602 and 603 receive control inputs from a wrapper Link bus 606. The enable inputs (Enable-1,2,3) of wrappers 307–309 are provided by an Enable bus 607.

Figure 6B:
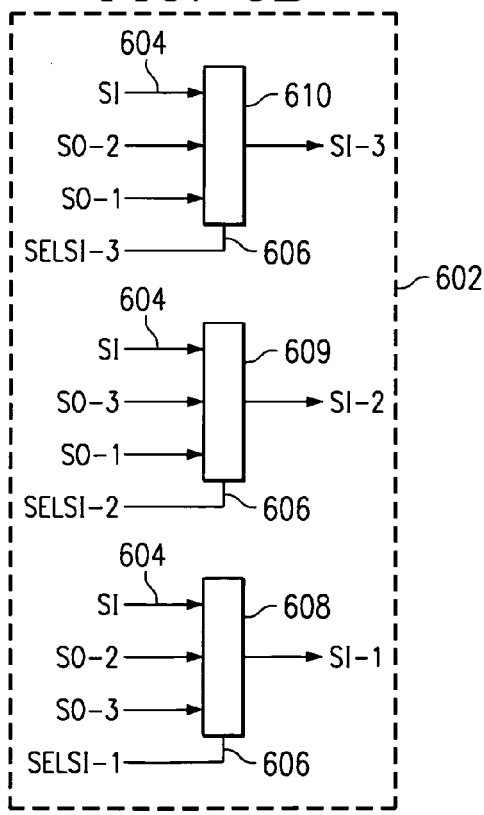
FIG. 6B illustrates input linking circuitry of the FIG. 6A test architecture.
Figure 6C:
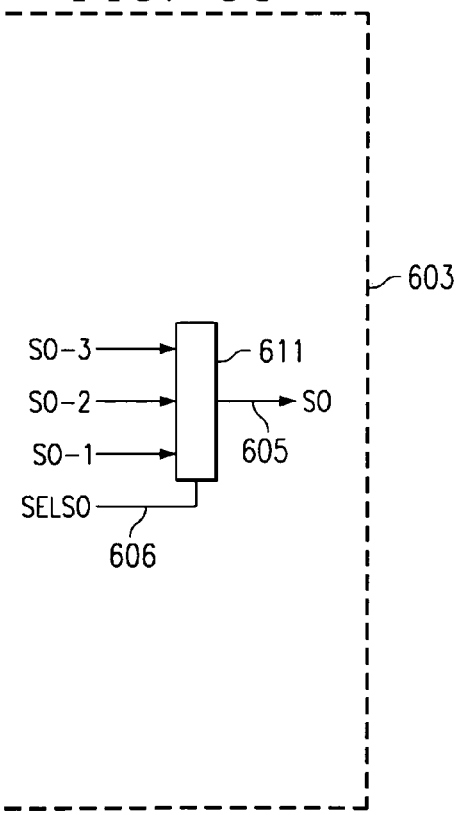
FIG. 6C illustrates output linking circuitry of the FIG. 6A test architecture.

FIGS. 6B and 6C illustrate example implementations of input linking circuitry 602 and output linking circuitry 603, respectively. Input linking circuitry 602 of FIG. 6B comprises multiplexers 608–610 which provide selectable connections between the serial inputs (SI-1, SI-2, SI-3) of wrappers 307–309 and signals SI 604, SO-1, SO-2, and SO-3. Multiplexers 608–610 receive linking control (SELSI-1, SELSI-2, SELSI-3) inputs from Link bus 606. The link control inputs 606 to multiplexer 610 enable the SI-3 serial input to wrapper 309 to be connected to SI, SI-1, or SI-2. The link control inputs 606 to multiplexer 609 enable the SI-2 serial input to wrapper 308 to be connected to SI, SI-1, or SI-3. The link control inputs 606 to multiplexer 608 enable the SI-1 serial input to wrapper 307 to be connected to SI, SI-2, or SI-3. Output linking circuitry 603 of FIG. 6C comprises multiplexer 611 which, in response to link control inputs from Link bus 606, allows connecting either the SO-1 output of wrapper 307, the SO-2 output of wrapper 308, or the SO-3 output of wrappers 309 to SO 605.

Figure 7:
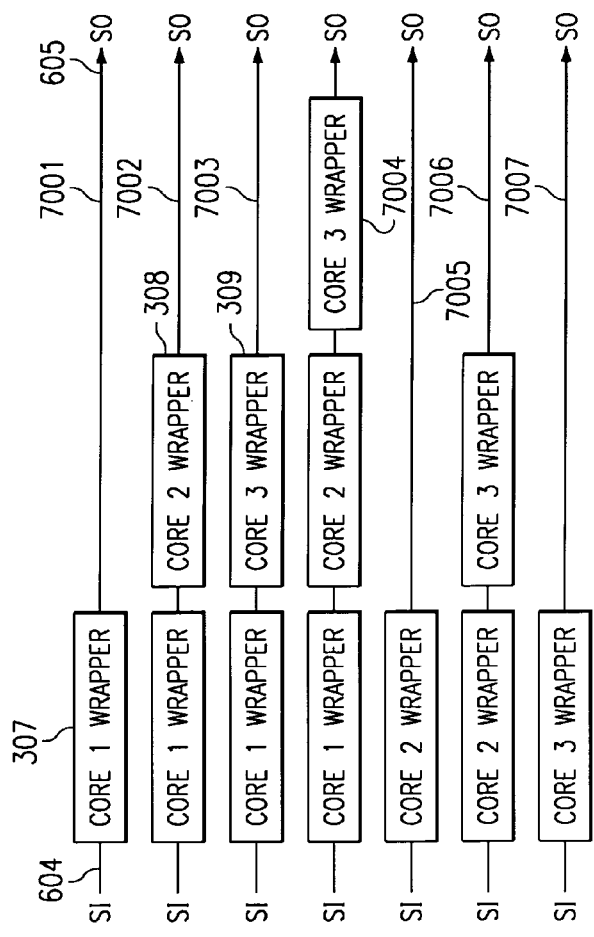
FIG. 7 illustrates wrapper arrangements for the FIG. 6A test architecture.
Figure 5:
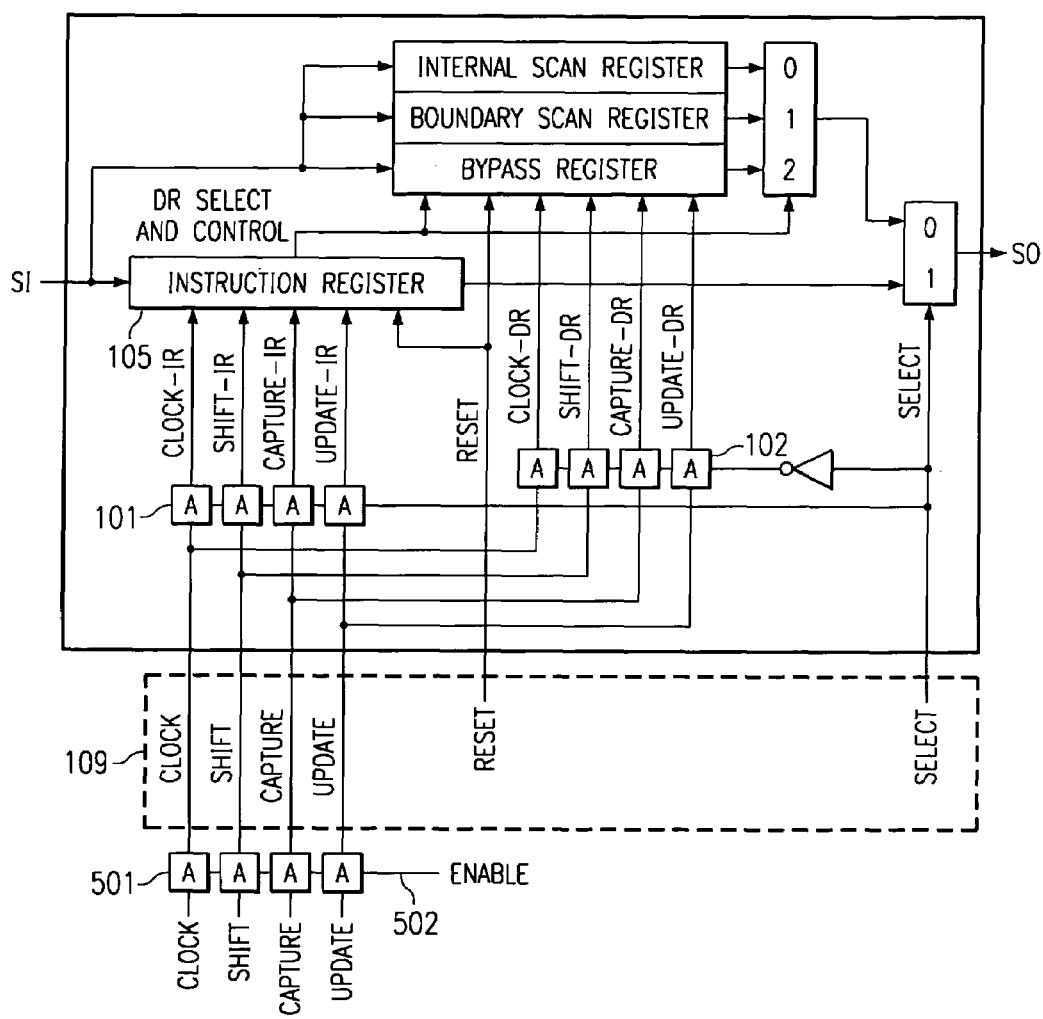
FIG. 5 illustrates a wrapper with an external enable circuit.

FIG. 7 illustrates the various wrapper arrangements 7001–7007 possible between the SI 604 and SO 605 of test architecture 601. These wrapper arrangements are formed by inputting link controls to input and output circuitry 602 and 603 via Link bus 606, and by inputting enable controls to wrappers 307–308 via Enable bus 607. Arrangement 7001 contains only wrapper 307 between SI and SO. Arrangement 7002 contains wrappers 307 and 308 in series between SI and SO. Arrangement 7003 contains wrappers 307 and 309 in series between SI and SO. Arrangement 7004 contains wrappers 307, 308, and 309 in series between SI and SO. Arrangement 7005 contains wrapper 308 between SI and SO. Arrangement 7006 contains wrappers 308 and 309 in series between SI and SO. Arrangement 7007 contains wrapper 309 between SI and SO.

As can be seen in FIG. 7, the test architecture 601 allows for the wrapper arrangement 301 of FIG. 3 as well as many different wrapper arrangements. The Link 606 and Enable 607 inputs to test architecture 601 may come from IC pads or from circuitry within the IC, such as an IEEE 1149.1 Test Access Port circuit. While IC pads or Test Access Port circuits may provide the Link and Enable inputs, a preferred method of providing the Link and Enable inputs to the test architecture 601 is described in detail below.

FIG. 8A illustrates circuitry for providing the Link 606 and Enable 607 control inputs to test architecture 601, according to the present disclosure. The circuitry includes a Link Instruction Register (LIR) 801 in series with the test architecture 601. The LIR 801 has a serial input 802 connected to 50 605 of the test architecture 601, a serial output (SO) 803, control inputs connected to test interface control bus 109, and control outputs 804 connected to the Link 606 and Enable 607 inputs of test architecture 601. The LIR 801 consists of 3-bit instruction register (IR) 805, a multiplexer 806, and gating circuitry 807.

During instruction scan operations, the select signal 808 of control bus 109 is high to enable the gating circuitry 807 to pass the control signals 109 to the 3-bit IR 805 and to connect the serial output of IR 805 to SO 803 via multiplexer 806. In the instruction scan mode, the 3-bit IR 805 shifts instruction data when the test architecture shifts instruction data. Thus, during instruction scan operations, the 3-bit IR 805 becomes part of the instruction scan path between SI 604 and SO 803.

During data scan operations, the select signal 808 of control bus 109 is low to disable the gating circuitry 807 from passing control signals 109 to the 3-bit IR 805 and to connect SO 605 of test architecture 601 to SO 803 via multiplexer 806. In the data scan mode, the 3-bit IR 805 is disabled and the LIR simply forms a bypass connection between the SO 605 of test architecture 601 and the SO 803 of the LIR. Thus, during data scan operations, the LIR is included in the data scan path between SI 604 and SO 803, but it does not add to the bit length of the data scan path. Also, since the control bus 109 is gated off during data scan operations, the data contained in the LIR's IR 805 cannot be changed during data scan operations.

It should be noted that while the LIR 801 has been shown inserted in the serial output path from the test architecture 601 (i.e. LIR input 802 connected to test architecture SO output 605), it could be have been similarly inserted in the serial input path to the test architecture 601 as well (i.e. LIR output 803 connected to test architecture SI input 604). Thus the position of the LIR 801 with respect to it being positioned at the beginning or ending of the serial path through the test architecture does not impact its ability to provide control of the Link 606 and Enable 607 bus inputs to the test architecture 601.

FIG. 8B illustrates that the circuitry of the 3-bit IR 805 consists of a 3-bit shift register 810, a 3-bit update register 811, and decode logic 812. During the shift step of an instruction scan operation, the 3-bit shift register 810 shifts data from its serial input to its serial output. During the update step of an instruction scan operation the data shifted into the 3-bit shift register 810 is transferred to the 3-bit update register 811. The 3-bit update register outputs this data to decode logic 812. The outputs of decode logic 812 respond to the data input from the 3-bit update register to output Link 606 and Enable 607 control signals to test architecture 601 via bus 804. Reset signal 809 of control bus 109 is used to initialize shift register 810 and update register 811, such that bus 804 may be set to a desired Link and Enable input state to test architecture 601. While the examples of FIGS. 8A and 8B use a 3-bit IR, the IR could be of any bit length. The use of a 3-bit IR will be seen to be sufficient in selecting the wrapper arrangements described in regard to FIG. 9 below.

FIG. 9 illustrates the various wrapper arrangements 9001–9007 between SI 604 and SO 803 in response to different 3-bit codes scanned into LIR 801. When the reset signal 809 is activated, the instruction registers 105 of wrappers 307–309 are initialized to a first instruction that selects the bypass registers 106 of the wrappers and enables normal operation of their associated cores. Also in response to the reset signal 809, LIR 801 is initialized to contain all zeros, i.e. LIR=000.

As seen in arrangement 9001, when the LIR contains a 000 code following a reset or an instruction scan operation it outputs Link 606 and Enable 607 control to enable and connect wrapper 307 in the scan path between SI 604 and SO 803. The other wrappers 308–309 are disabled and disconnected from the scan path between SI 604 and SO 803.

As seen in arrangement 9002, when the LIR contains a 001 code following an instruction scan operation it outputs Link 606 and Enable 607 control to enable and connect wrappers 307 and 308 in the scan path between SI 604 and SO 803. Wrapper 309 is disabled and disconnected from the scan path between SI 604 and SO 803.

As seen in arrangement 9003, when the LIR contains a 010 code following an instruction scan operation it outputs Link 606 and Enable 607 control to enable and connect wrappers 307 and 309 in the scan path between SI 604 and SO 803. Wrapper 308 is disabled and disconnected from the scan path between SI 604 and SO 803.

As seen in arrangement 9004, when the LIR contains a 011 code following an instruction scan operation it outputs Link 606 and Enable 607 control to enable and connect wrappers 307–309 in the scan path between SI 604 and SO 803.

As seen in arrangement 9005, when the LIR contains a 100 code following an instruction scan operation it outputs Link 606 and Enable 607 control to enable and connect wrapper 308 in the scan path between SI 604 and SO 803. The other wrappers 307 and 309 are disabled and disconnected from the scan path between SI 604 and SO 803.

As seen in arrangement 9006, when the LIR contains a 101 code following an instruction scan operation it outputs Link 606 and Enable 607 control to enable and connect wrappers 308 and 309 in the scan path between SI 604 and SO 803. Wrapper 307 is disabled and disconnected from the scan path between SI 604 and SO 803.

As seen in arrangement 9007, when the LIR contains a 110 code following an instruction scan operation it outputs Link 606 and Enable 607 control to enable and connect wrapper 309 in the scan path between SI 604 and SO 803. The other wrappers 307 and 308 are disabled and disconnected from the scan path between SI 604 and SO 803.

In all arrangements 9001–9007, instruction scan operations shift data through the 3-bit IR 805 of LIR 801, but data scan operations do not shift data through the 3-bit IR 805 of LIR 801, as previously described. A current arrangement 9001–9007 will be maintained following an instruction scan operation as long as the 3-bit LIR code is not changed by the instruction scan operation.

Some advantages of using the LIR 801 to control the Link 606 and Enable 607 inputs to the test architecture 601 are listed below.

The LIR 801 exists and operates within the scan path of each selected wrapper arrangement 9001–9007. Therefore no additional circuitry and/or interfaces (for example no 1149.1 Test Access Port and/or IC interface pads as mentioned in regard to FIG. 7) are required to control the Link 606 and Enable 607 buses to switch between wrapper arrangements.

The LIR 801 provides the opportunity of switching between wrapper arrangements 9001–9007 following each instruction scan operation. Thus the shifting in and updating of LIR wrapper arrangement codes and wrapper test instructions may be performed during the same instruction scan operation.

Figure 1:
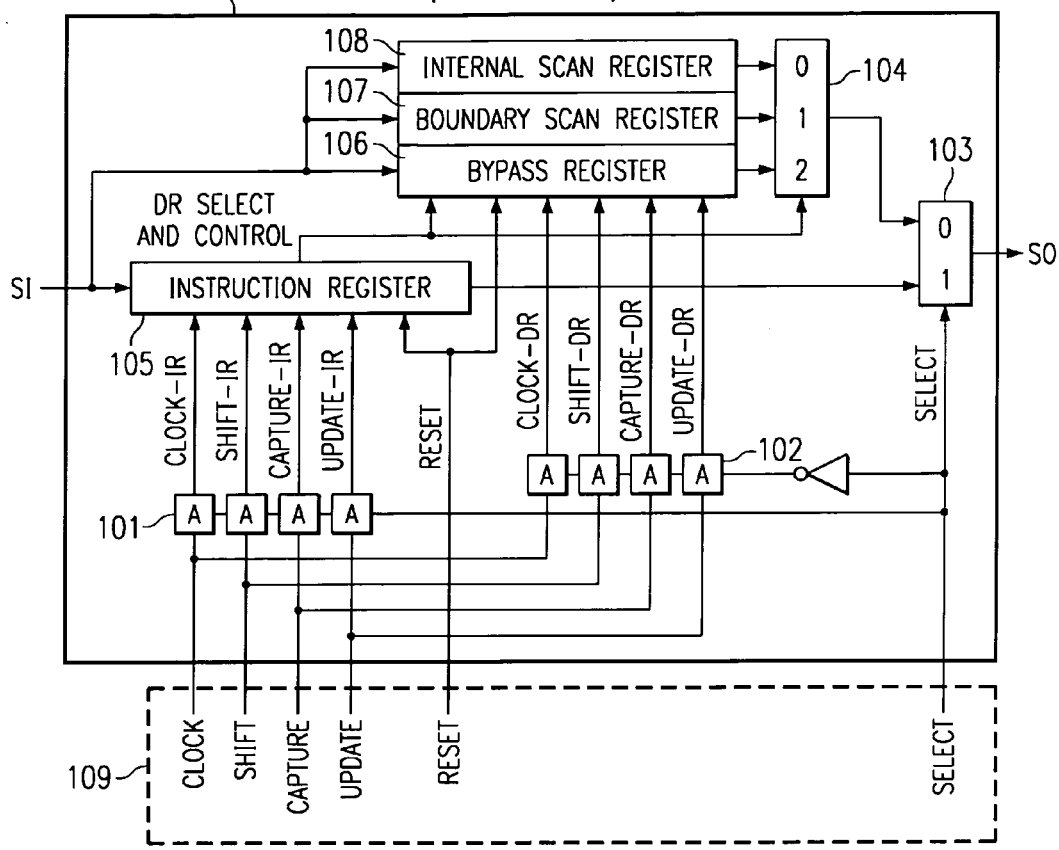
FIG. 1 illustrates a known core test wrapper.
Figure 2:
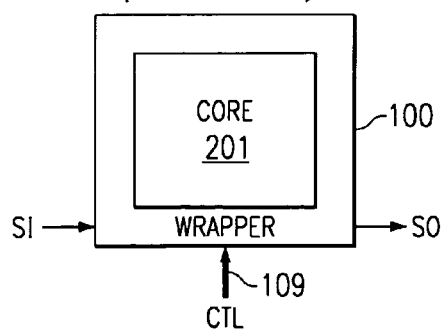
FIG. 2 illustrates a core with a known wrapper.

The LIR 801 does not add bits to a selected wrapper arrangement 9001–9007 during data scan operations. By not adding to the bit length of a given wrapper arrangement, the test patterns applied to the wrapper arrangement do not have to be modified to accommodate the presence of the LIR. For example, if a test pattern set existed for testing core 1 using the internal scan register 108 (FIG. 1) of wrapper 307, arrangement 9001 could be selected via an instruction scan operation then the test patterns could be applied using data scan operations. Since the LIR does not add bits to the length of arrangement 9001 during data scan operations, the core 1 test pattern set can be applied without modification, enabling core 1 test pattern reuse.

Figure 10:
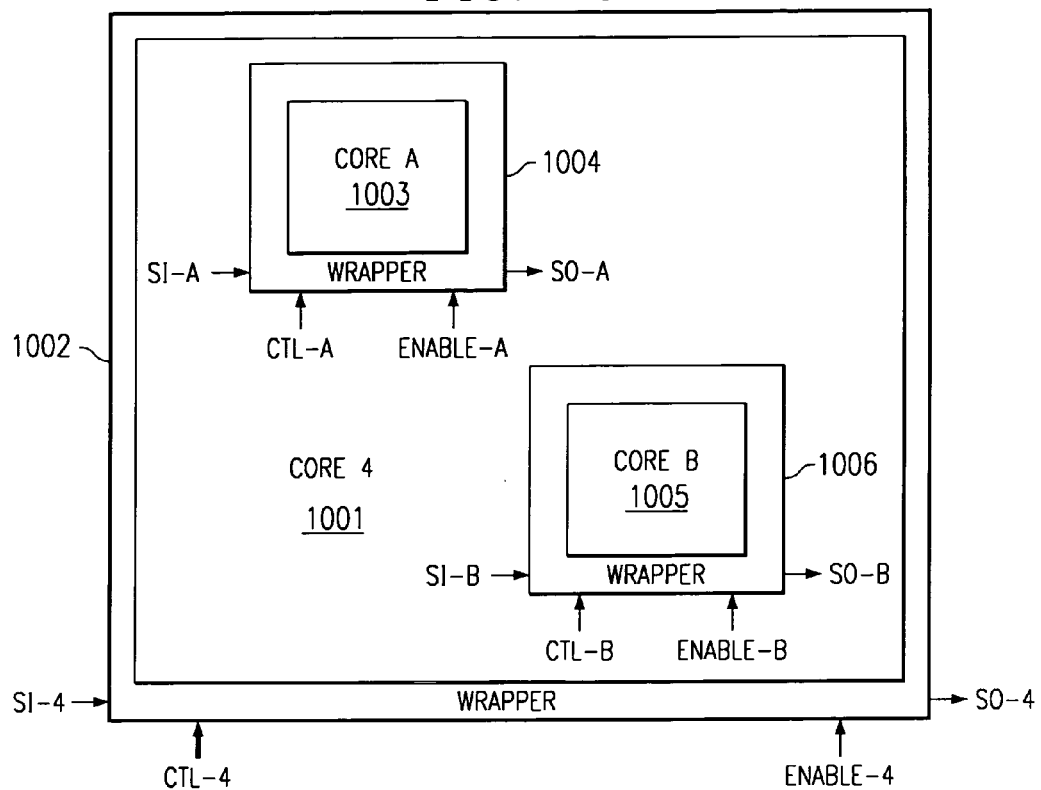
FIG. 10 illustrates a wrapped core containing wrapped cores A and B.

FIG. 10 illustrates an example of a core 4 1001 which has a wrapper 1002. Core 4 differs from the previously described cores 1–3 in that it contains an embedded core A 1003 having a wrapper 1004 and an embedded core B 1005 having a wrapper 1006. Access to wrapper 1002 is provided via SI-4, SO-4, CTL-4, and Enable-4. Access to wrapper 1004 is provided via SI-A, SO-A, CTL-A, and Enable-A. Access to wrapper 1006 is provided via SI-B, SO-B, CTL-B, and Enable-B.

Figure 11:
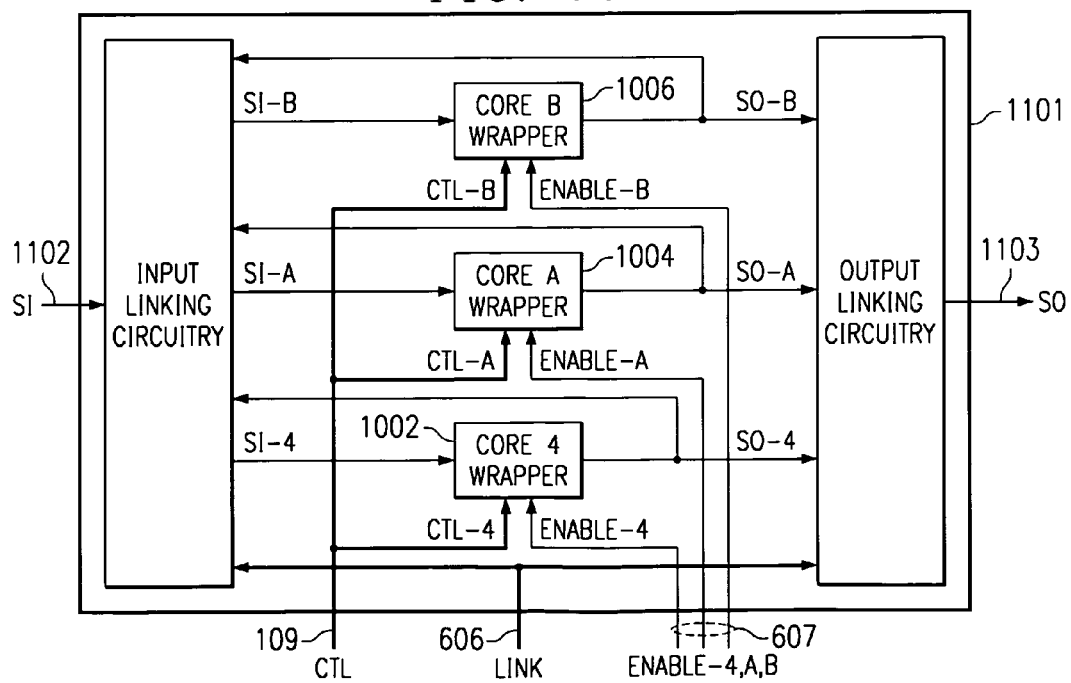
FIG. 11 illustrates a test architecture for the wrappers of FIG. 10.

FIG. 11 illustrates the test architecture 1101 of the present disclosure being used to provide access to wrappers 1002, 1004, and 1006 of core 4. The test architecture is similar to the test architecture 601 described in regard to FIG. 6 with the exceptions that; (1) wrapper 1002 has been substituted for wrapper 307, (2) wrapper 1004 has been substituted for wrapper 308, (3) and wrapper 1006 has been substituted for wrapper 309.

Figure 12:
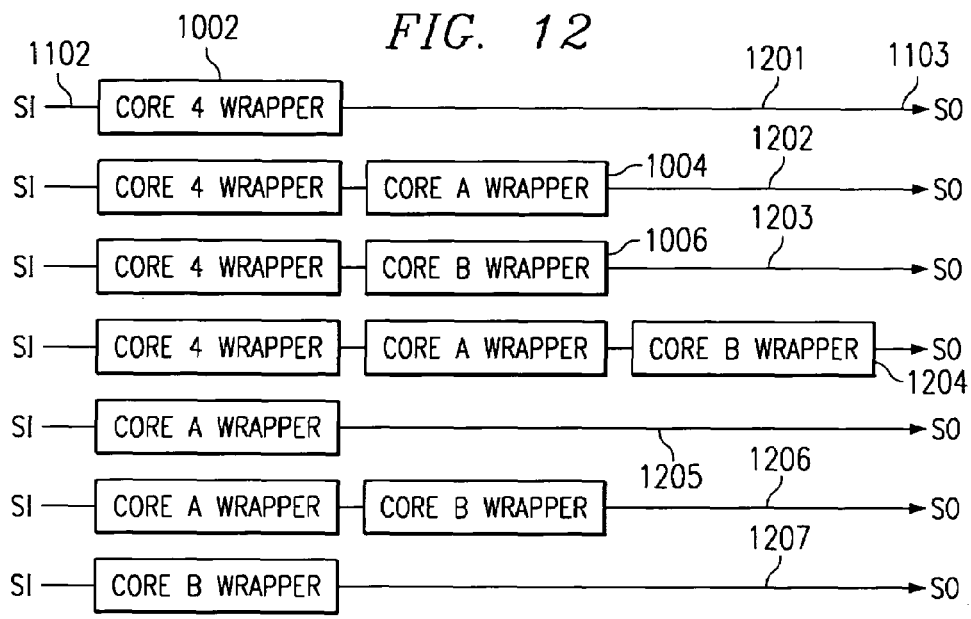
FIG. 12 illustrates FIG. 10 wrapper arrangements.

FIG. 12 illustrates the wrapper arrangements 1201–1207 selectable via the Link 606 and Enable 607 buses of test architecture 1101. The wrapper arrangements 1201–1207 are the same as wrapper arrangements 7001–7007 of FIG. 7 with the exceptions that; (1) wrapper 1002 has been substituted for wrapper 307, (2) wrapper 1004 has been substituted for wrapper 308, (3) and wrapper 1006 has been substituted for wrapper 309.

Figure 13:
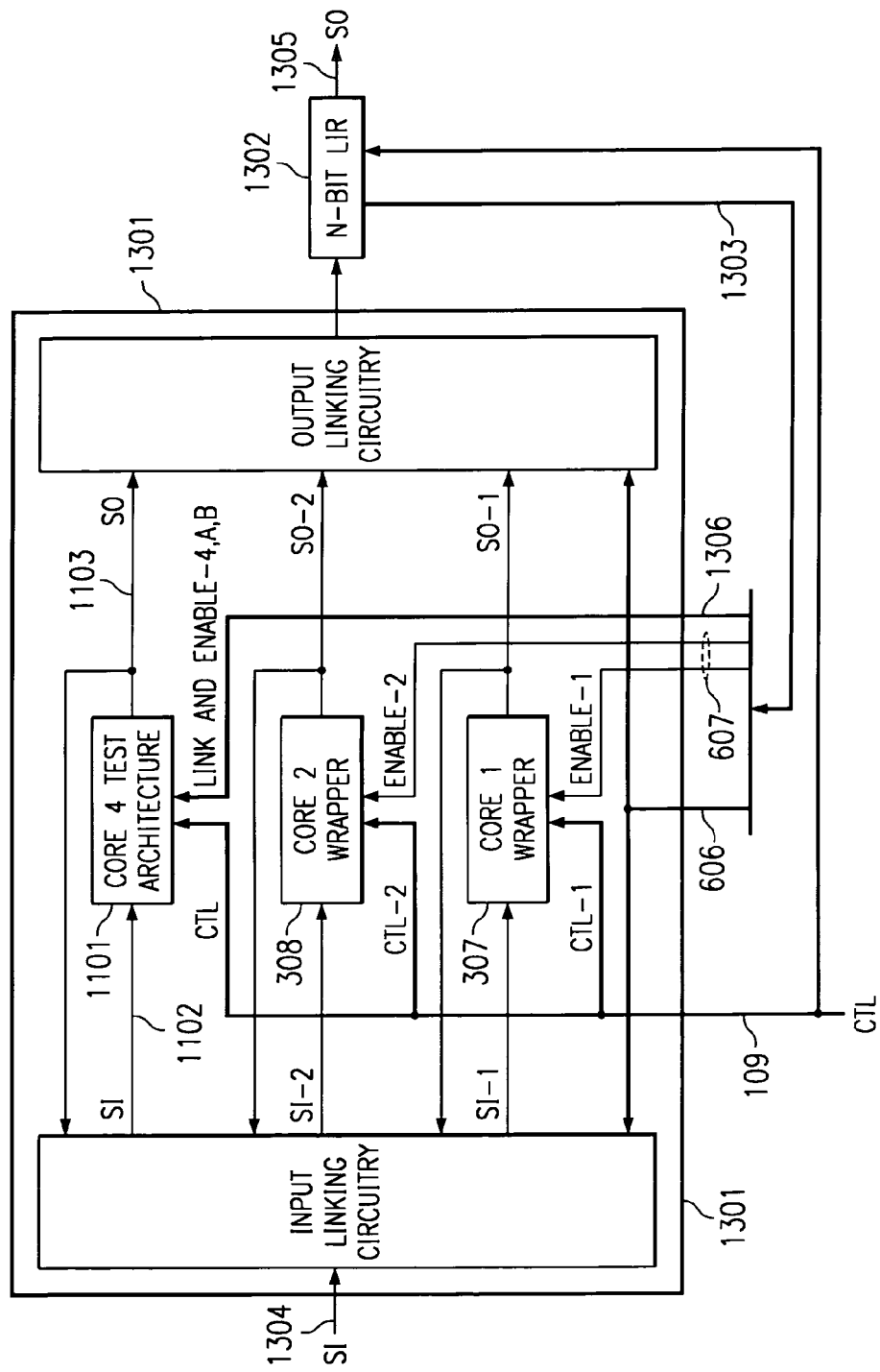
FIG. 13 illustrates a test architecture embedded within another test architecture.

FIG. 13 illustrate a test architecture 1301 of the present disclosure which contains wrapper 307, wrapper 308, and the test architecture 1101 of FIG. 11. Test architecture 1301 is similar to the test architecture 601 of FIG. 6 with the exception that test architecture 1101 has been substituted for the core 3 wrapper 309. Test architecture 1301 is serially connected to an N-bit LIR 1302 which provides control input via bus 1303 to the Link 606 and Enable 607 buses of test architecture 1301 and to the Link and Enable buses 1306 of test architecture 1101, as described previously in regard to the 3-bit LIR 810 of FIG. 8A. The N-bit LIR 1302 is similar to the 3-bit LIR 810 except that its IR contains addition bits for decoding the additional Link and Enable-4, A, B signals 1306 required by test architecture 1101.

Embedding test architecture 1101 within test architecture 1301 requires that the Link and Enable-4, A, B signals 1306 of test architecture 1101 be brought out of test architecture 1301 so they can be controlled by the N-bit LIR via bus 1303. Thus the N-bit LIR not only provides the Link 606 and Enable 607 signals for test architecture 1301, but also the Link 606 and Enable signals 1306 for the embedded test architecture 1101.

Figure 14:
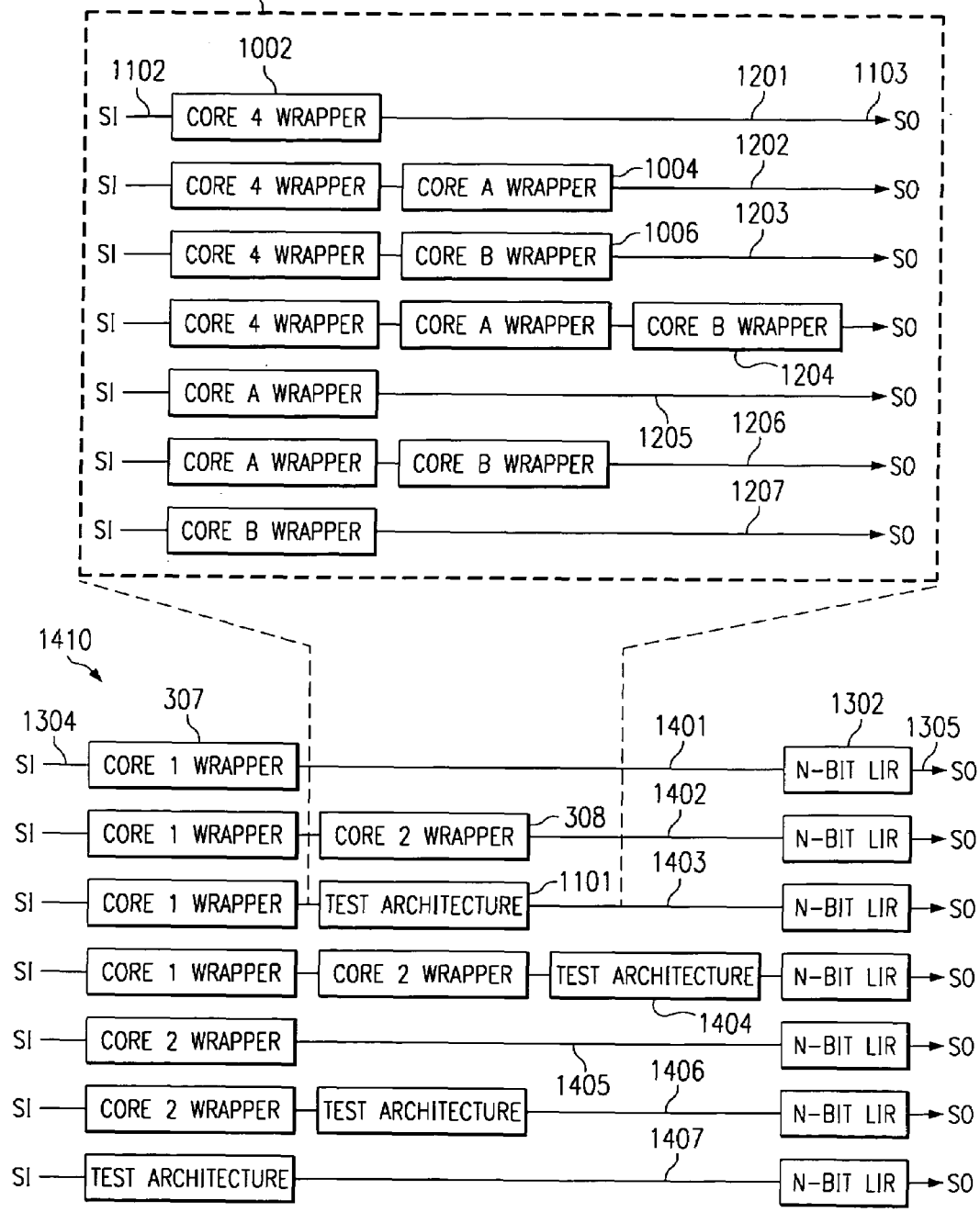
FIG. 14 illustrates the hierarchical access of FIG. 13 wrapper arrangements.

FIG. 14 illustrates in 1410 the N-bit LIR 1302 controlled arrangements 1401–1407 of test architecture 1301. As can be seen in 1410, the N-bit LIR can be loaded with codes to select; (1) wrapper 307 between SI 1304 and SO 1305 (arrangement 1401), (2) wrappers 307 and 308 between SI and SO (arrangement 1402), (3) wrapper 307 and test architecture 1101 between SI and SO (arrangement 1403), (4) wrappers 307, 308, and test architecture 1101 between SI and SO (arrangement 1404), (5) wrapper 308 between SI and SO (arrangement 1405), (6) wrapper 308 and test architecture 1101 between SI and SO (arrangement 1406), and (7) test architecture 1101 between SI and SO (arrangement 1407).

FIG. 14 further illustrates in 1420 that when test architecture 1101 is included in a test architecture 1301 arrangement between SI 1304 and SO 1305, the N-bit LIR provides control for selecting the particular arrangement between the 1101 test architectures SI 1102 and SO 1103. As can be seen in 1420, the N-bit LIR can be loaded with codes to select; (1) wrapper 1002 between SI 1102 and SO 1103 (arrangement 1201), (2) wrappers 1002 and 1004 between SI and SO (arrangement 1202), (3) wrapper 1002 and 1006 between SI and SO (arrangement 1203), (4) wrappers 1002, 1004, and 1006 between SI and SO (arrangement 1204), (5) wrapper 1004 between SI and SO (arrangement 1205), (6) wrapper 1004 and 1006 between SI and SO (arrangement 1206), and (7) wrapper 1006 between SI and SO (arrangement 1207).

FIGS. 10–14 have illustrated how one test architecture 1101 of the present disclosure may be embedded within another test architecture 1301 of the present disclosure and both test architectures accessed using a single LIR. For simplification, only one test architecture 1101 was illustrated as being embedded in test architecture 1301. However, it should be understood that a plurality of test architectures 1101 can be embedded in test architecture 1301. For example, substituting a second test architecture 1101 for wrapper 308 and a third test architecture 1101 for wrapper 307 in FIG. 13 would illustrate the embedding of three 1101 test architectures within test architecture 1301.

While only a single level of test architecture embedding was shown, i.e. test architecture 1101 embedded within test architecture 1301, it is clear that the multiple levels of test architecture embedding is possible using the present disclosure. When multiple levels of test architecture embedding is performed, the number of control signals that must be output from the LIR increases, as can be understood from the inspection of bus 1303 of FIG. 13. At some point the number of LIR output control signals may reach a level that is unacceptable due to wire routing concerns within an IC. The following describes an alternate embodiment of the present disclosure that provides a solution to this LIR output control signal wire routing problem.

Figure 15:
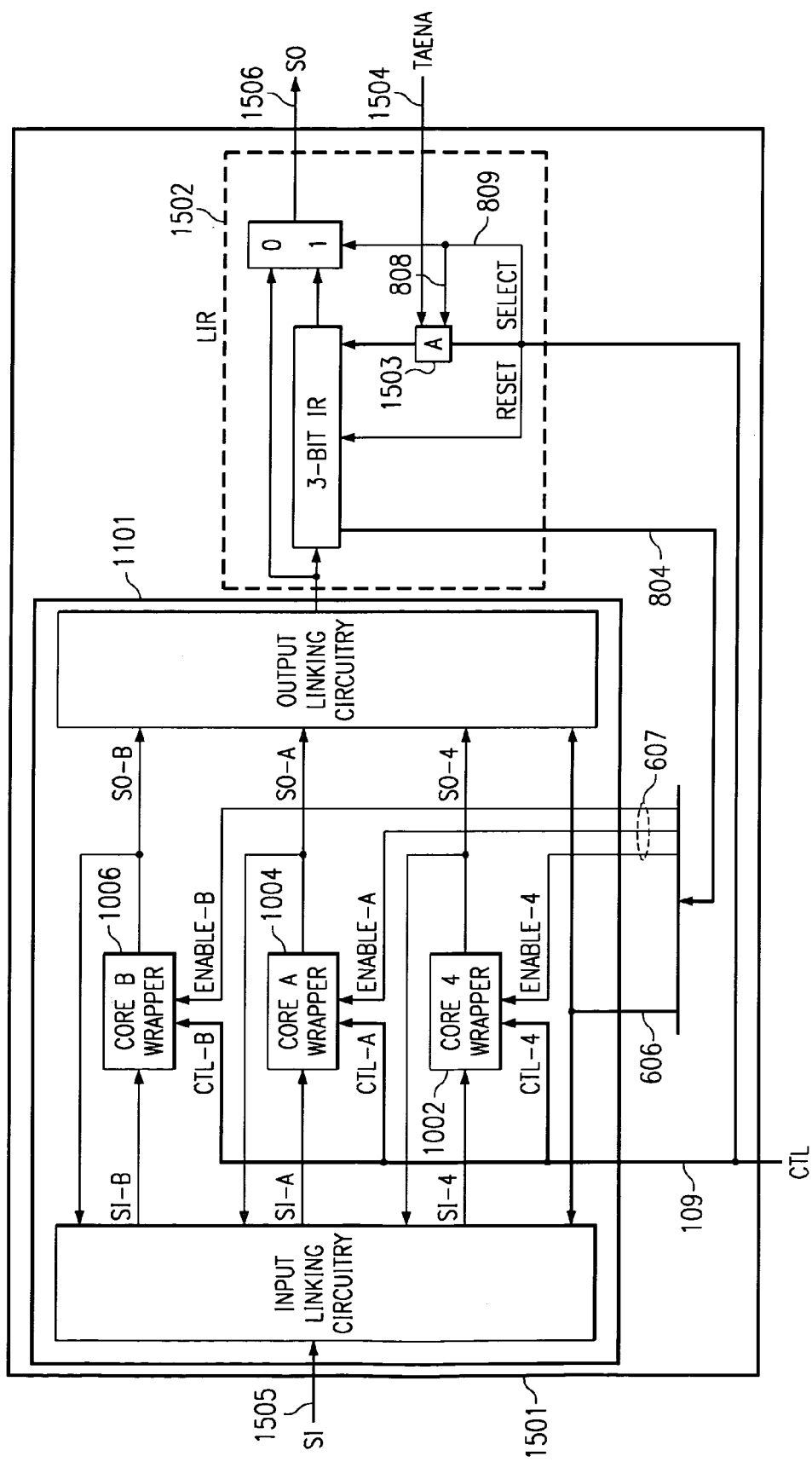
FIG. 15 illustrates a test architecture including a LIR according to the disclosure.

FIG. 15 illustrates an alternate preferred test architecture 1501 according to the present disclosure that combines the core 4 test architecture 1101 of FIG. 11 with a LIR 1502. LIR 1502 is similar to LIR 801 of FIG. 8A with the exception that gating circuitry 1503 replaces gating circuitry 807. Gating circuitry 1503 provides, in addition to the select signal from control bus 109, an additional input for a test architecture enable (TAENA) signal 1504. The TAENA signal 1504 is similar to the select signal 808 in that it operates to; (1) enable gating circuitry 1503 to pass control bus signals 109 to the 3-bit IR during instruction scan operations, or (2) disable gating circuitry 1503 from passing control bus signals 109 to the 3-bit IR during instruction scan operations. Thus the only time the 3-bit IR receives control bus 109 signals is when TAENA 1504 and select 808 are both set to enable gating circuitry 1503 to pass control bus 109 signals to the 3-bit IR.

Figure 16:
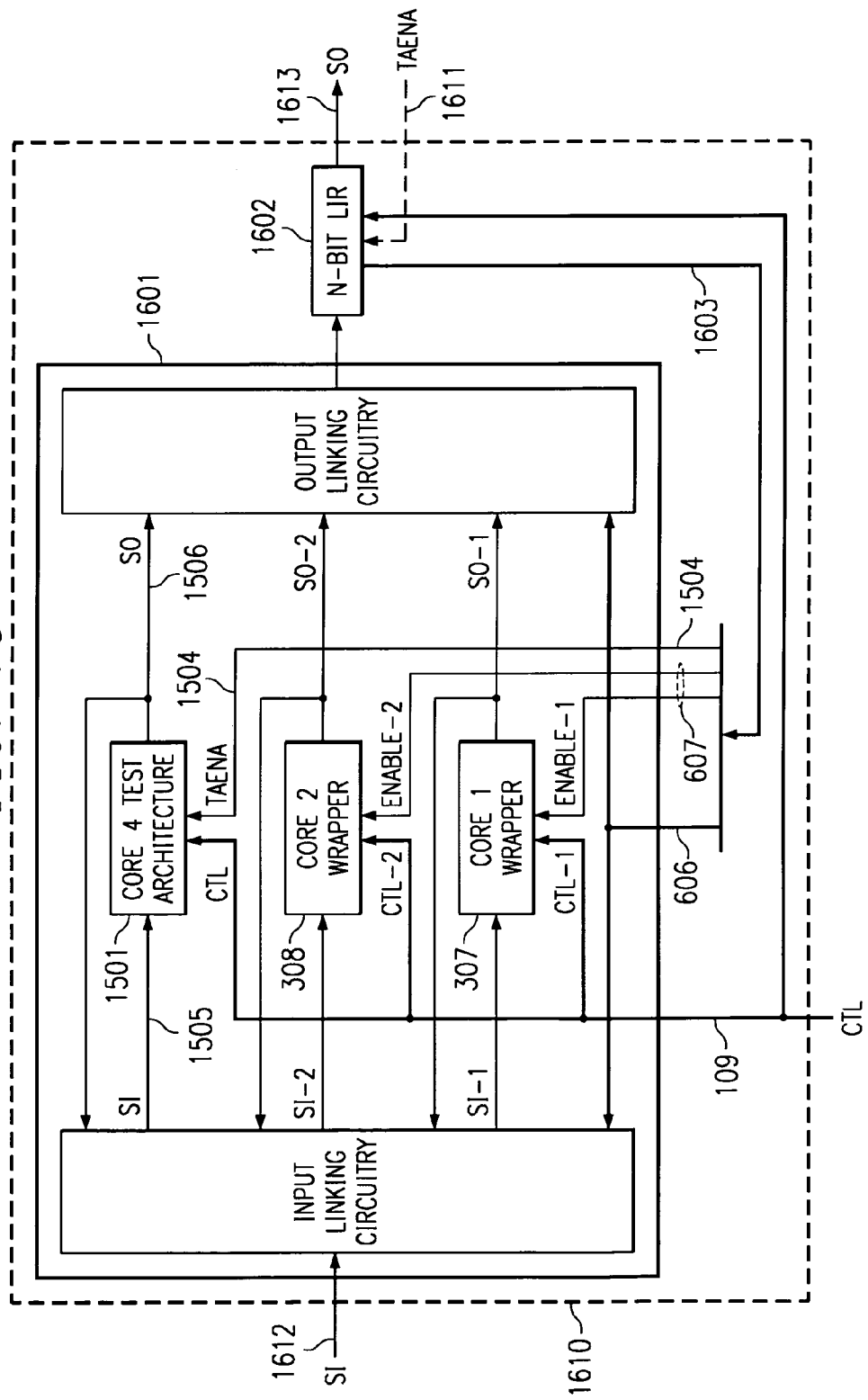
FIG. 16 illustrates a test architecture containing the FIG. 15 test architecture.

FIG. 16 illustrates a test architecture 1601 of the present disclosure which contains wrapper 307, wrapper 308, and the test architecture 1501 of FIG. 15. Test architecture 1601 is similar to the test architecture 1301 of FIG. 13 with the exception that test architecture 1501 has been substituted for test architecture 1101. Test architecture 1601 is serially connected to an N-bit LIR 1602 which provides control input via bus 1603 to the Link 606 and Enable 607 buses of test architecture 1601 and the TAENA signal 1504 to test architecture 1501. The N-bit LIR 1602 is similar to the N-bit LIR 1302 except that it contains a reduced number of bits and control signal outputs, since it does not need to decode all the Link and Enable-4, A, B signals that were required by the embedded test architecture 1101 of test architecture 1301. Embedding test architecture 1501 within test architecture 1601 only requires that the TAENA signal 1504 be brought out of test architecture 1601 so it can be controlled by the N-bit LIR via bus 1603.

Figure 17:
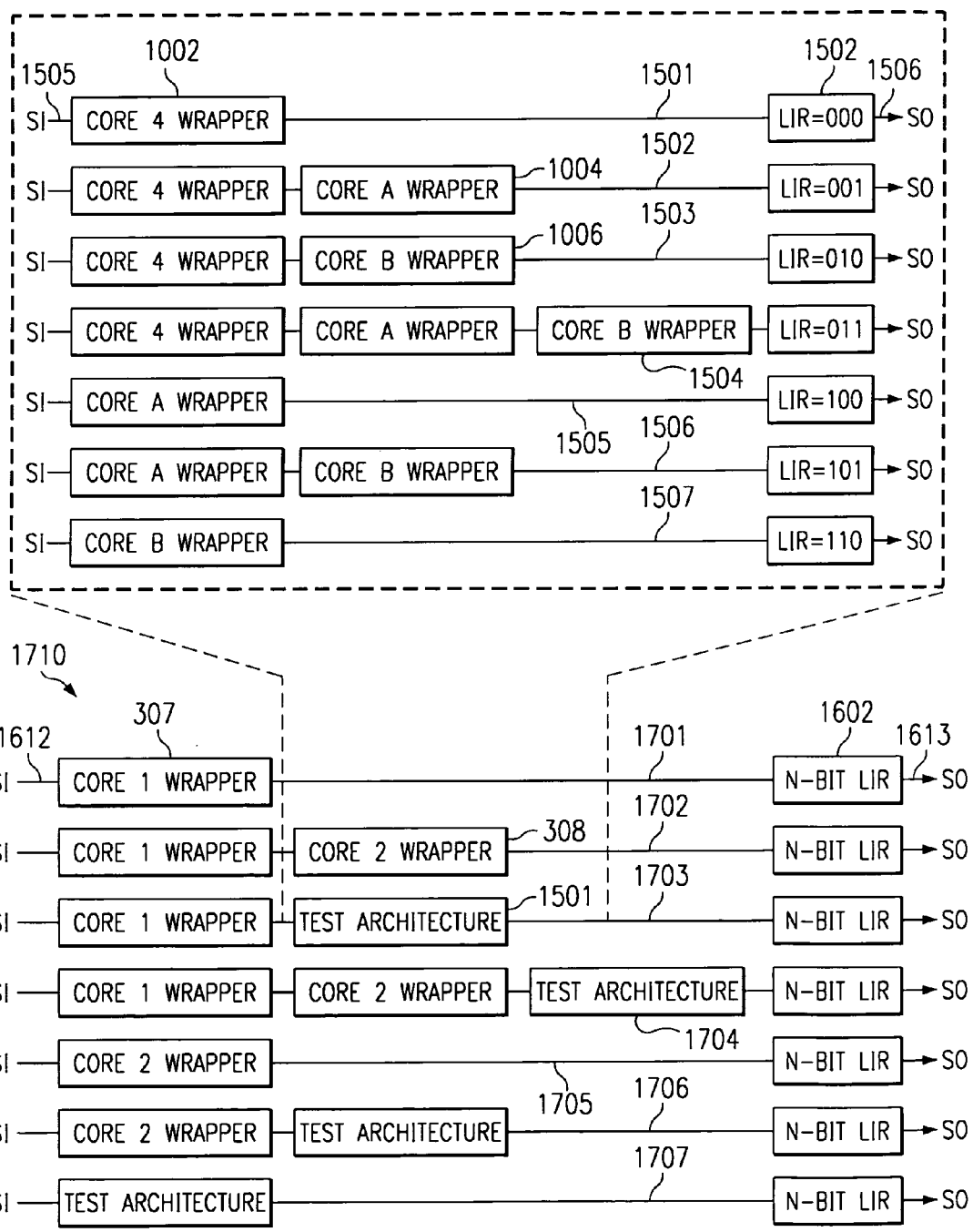
FIG. 17 illustrates the hierarchical access of FIG. 16 wrapper arrangements.

FIG. 17 illustrates in 1710 the N-bit LIR 1602 controlled arrangements 1701–1707 of test architecture 1601. As can be seen in 1710, the N-bit LIR can be loaded with codes to select; (1) wrapper 307 between SI 1612 and SO 1613 (arrangement 1701), (2) wrappers 307 and 308 between SI and SO (arrangement 1702), (3) wrapper 307 and test architecture 1501 between SI and SO (arrangement 1703), (4) wrappers 307, 308, and test architecture 1501 between SI and SO (arrangement 1704), (5) wrapper 308 between SI and SO (arrangement 1705), (6) wrapper 308 and test architecture 1501 between SI and SO (arrangement 1706), and (7) test architecture 1501 between SI and SO (arrangement 1707).

FIG. 17 further illustrates in 1720 that when test architecture 1501 is included in a test architecture 1601 arrangement between SI 1612 and SO 1613 by appropriate setting of the TAENA signal 1504, the 3-bit LIR 1502 of test architecture 1501 is included in the arrangement and made accessible during instruction scan operations. The 3-bit LIR of test architecture 1501 can be scanned to select any particular arrangement between the 1501 test architectures SI 1505 and SO 1506. As can be seen in 1720, the 3-bit LIR 1502 can be loaded with codes to select; (1) wrapper 1002 between SI 1505 and SO 1506 (arrangement 1501), (2) wrappers 1002 and 1004 between SI and SO (arrangement 1502), (3) wrapper 1002 and 1006 between SI and SO (arrangement 1503), (4) wrappers 1002, 1004, and 1006 (arrangement 1504), (5) wrapper 1004 between SI and SO (arrangement 1505), (6) wrappers 1004 and 1006 between SI and SO (arrangement 1506), and (7) wrapper 1006 between SI and SO (arrangement 1507).

It should be clear from FIG. 17 that when test architecture 1501 is included in an arrangement 1710 of test architecture 1601, two LIRs will be scanned in series during instructions scan operations, LIR 1602 and LIR 1502. Also it should be clear that since LIR 1502 provides within the test architecture 1501 all the control signals required to select the test architecture 1501 arrangements 1720, via bus 804 of FIG. 15, the wire routing problem mentioned in regard to FIG. 13 is significantly reduced. The only control signal LIR 1602 needs to provide to include test architecture 1501 in an arrangement 1710 is the TAENA signal 1504. Once included, the LIR 1502 of test architecture 1501 becomes enabled and can be scanned to provide all the additional signals required for selecting arrangements 1720 within test architecture 1501.

The advantage test architecture 1501 has over test architecture 1101 is that when test architectures 1501 is embedded within another test architecture 1601, only the TAENA 1504 signal of test architecture 1501 is required to be brought out of the other test architecture 1601 to be accessed by a LIR 1602 connected to the other test architecture 1601. This can be compared to test architecture 1301 of FIG. 13 where it was required to bring out the Link & Enable-4, A, B signals of test architecture 1101 to be connected to LIR 1302. As described earlier in regard to test architecture 1101 and 1301 of FIG. 13, multiple test architectures 1501 could have been shown embedded within test architecture 1610, by simply substituting a second and third test architecture 1501 for wrappers 308 and 307 respectively.

The process of making the TAENA signal of an embedded test architecture, like 1501, externally available at the I/O boundary of a next higher level test architecture, like 1601, forms the basis of a framework that can be used to access any hierarchically positioned test architecture within an IC. The following provides an example of this hierarchical test architecture access framework and the process for selecting embedded test architectures contained therein.

Figure 18:
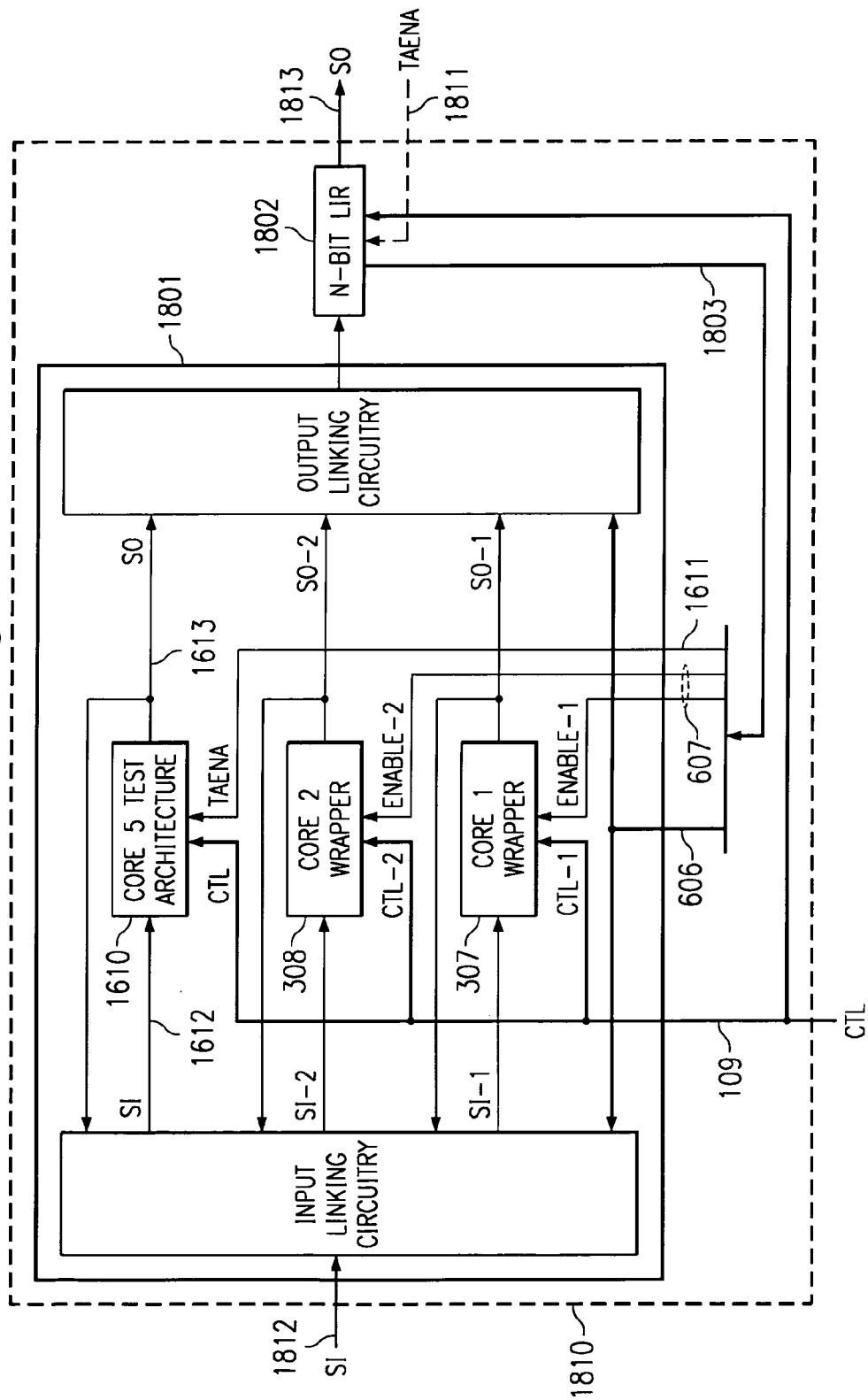
FIG. 18 illustrates further embedding of test architectures according to the disclosure.

FIG. 18 illustrates a test architecture 1801 containing wrapper 307, wrapper 308, and the test architecture 1610 of FIG. 16. Test architecture 1610 is similar to test architecture 1501 in that it combines a LIR 1602 with test architecture 1601, as test architecture 1501 combined the LIR 1502 with test architecture 1101. Test architecture 1610 has a TAENA signal 1611, as test architecture 1501 has a TAENA signal 1504. Test architecture 1610 is associated with a core 5, as test architecture 1501 is associated with a core 4. The LIR 1802 is connected to the TAENA 1611 signal of test architecture 1601 via bus 1803, as LIR 1602 is connected to TAENA 1504 signal of test architecture 1601 via bus 1603.

The process steps of accessing test architecture 1101 embedded within test architecture 1501, which is further embedded within test architecture 1610, which is still further embedded within test architecture 1810, is as follows. The process steps below are assumed to start at a point where only wrapper 307 and LIR 1802 of FIG. 18 are in the serial path between SI 1812 and SO 1813 of FIG. 18, similar to arrangement 9001 shown in FIG. 9.

Step 1 Perform a first instruction scan operation to load LIR 1802 with a code that sets TAENA 1611, via bus 1803, to a state that enables test architecture 1610. Following this instruction scan operation, test architecture 1610 and LIR 1802 are in the serial path between SI 1812 and SO 1813.

Step 2 Perform a second instruction scan operation to load LIR 1802 with a code that maintains TAENA 1611 at a state enabling test architecture 1610, and to load LIR 1602 of test architecture 1610 with a code that sets TAENA 1504 to a state that enables test architecture 1501. Following this instruction scan operation, test architecture 1501, LIR 1602, and LIR 1802 are in the serial path between SI 1812 and SO 1813.

Step 3 Perform a third instruction scan operation to load LIR 1802 and LIR 1602 with codes that maintain TAENA 1611 and TAENA 1504 at states enabling test architectures 1610 and 1501, and to load LIR 1502 of test architecture 1501 with a code that selects a desired arrangement 1201–1207 of test architecture 1101. Following this instruction scan operation, the selected arrangement 1201–1207 of test architecture 1101, LIR 1502, LIR 1602, and LIR 1802 are in the serial path between SI 1812 and SO 1813.

Step 4 Perform subsequent instruction and/or data scan operations to the selected arrangement 1201–1207 of test architecture 1101 as required to perform a desired test or other operation via the SI 1812 and SO 1813 terminals of the test architecture 1810 of FIG. 18. During subsequent instruction scan operations, the codes loaded into LIRs 1502, 1602, and 1802 should maintain access to the currently selected arrangement of test architecture 1101, unless a new arrangement is needed. Since, as previously mentioned in regard to FIG. 8A, data scan operations cannot change existing LIR codes, the access to test architecture 1101, setup by Steps 1–3 above, is not effected during subsequent data scan operations.

At some point in accessing embedded test architectures using data scan operations, the accumulation of the LIR bypass paths, i.e. the direct connection path coupling the LIR input 802 to the LIR output 803 via multiplexer 806 of FIG. 8A, may become to long for data to propagate at a desired data scan clock rate. In some cases therefore, it may be necessary to add a resynchronization flip-flop in the serial path between test architectures, such that during data scan operations the data may be re-timed as it passes between serially connected test architectures. A logical point to insert such a resynchronization flip-flop would be in the LIR bypass path described above. Placing it elsewhere would force instruction scan operations to unnecessarily have to pass through the resynchronization flip-flop.

Figure 19:
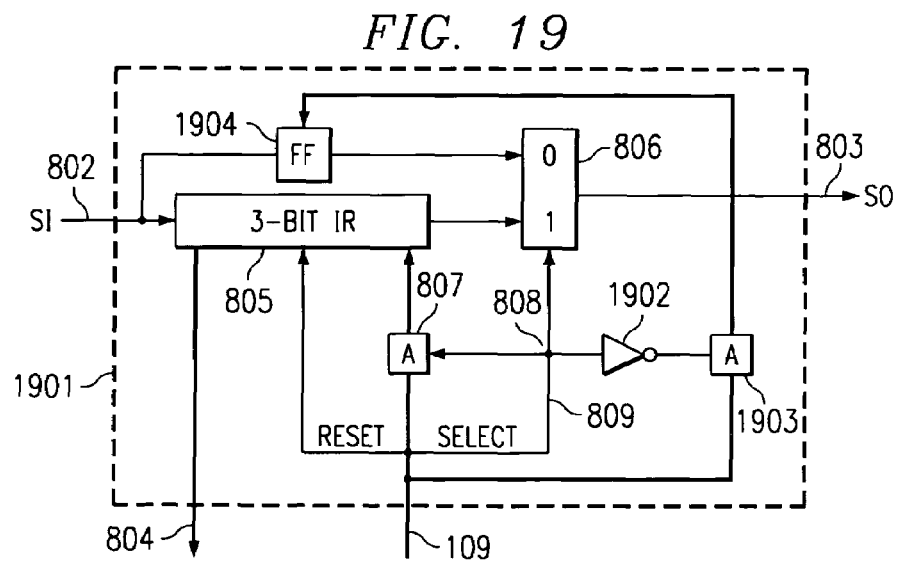
FIG. 19 illustrates an alternate LIR circuit example.

FIG. 19 illustrates an LIR 1901 containing a resynchronization register/flip-flop 1904 in the bypass path of the LIR. LIR 1901 is simply LIR 801 adapted to include flip-flop 1904 in the bypass path between LIR input 802 and LIR output 803 and circuitry 1902 and 1903 to enable the flip flop 1904 to receive control bus 109 input during data scan operations. During data scan operations the select signal will be low to select the registered bypass path through multiplexer 806 to SO 803. Inverter 1902 inverts the select signal so that during data scan operations And gating circuit 1903 passes bus 109 to flip flop 1904. In response to the clock signal of bus 109, flip-flop 1904 moves data from SI 802 to SO803. Use of LIR 1901 with a registered bypass path between input 802 and output 803 eliminates the above-described concern of using LIRs with direct connection bypass paths between input 802 and output 803.

Figure 20:
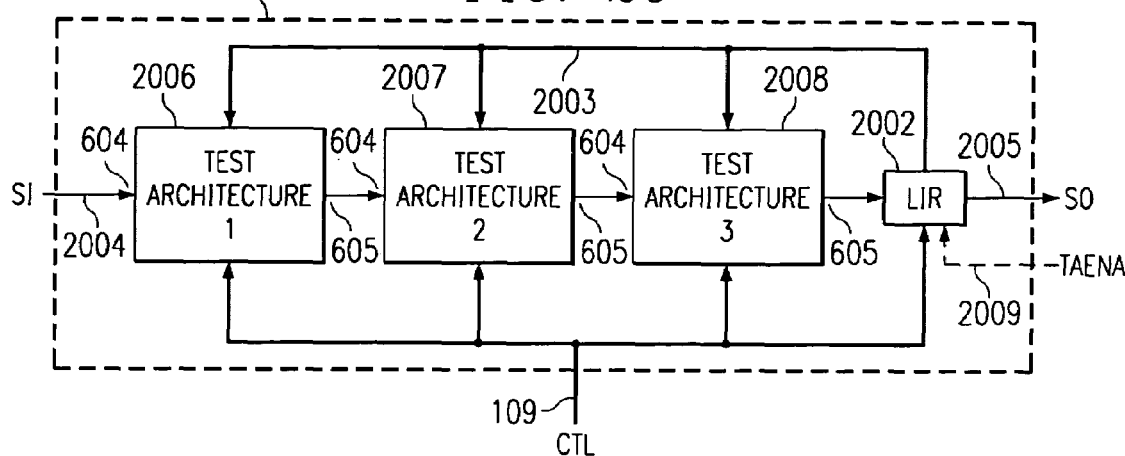
FIG. 20 illustrates a serial connection of test architectures according to the disclosure.

FIG. 20 illustrates a serial configuration 2001 of test architectures 2006–2008. The test architectures 2006–2008 are connected in a serial path between SI 2004 and SO 2005. The serial path includes a LIR 2002 that provides the link and enable control bus 2003 to the test architectures. Each test architecture and the LIR receive control input from control bus 109. A TAENA 2009 signal is shown being input to the LIR 2002 to indicate that the serial configuration 2001 of test architectures 2007–2008 may itself be a test architecture according to the present disclosure, being enabled and disabled by TAENA 2009 as previously described in regard to FIGS. 15, 16, and 18. If serial configuration 2001 is viewed as a test architecture 2001, it could be embedded within another test architecture as test architectures 1501 and 1610 were embedded within other test architectures 1610 and 1810, respectively. The following description assumes the serial configuration (or test architecture) 2001 is enabled by TAENA 2009.

During instruction or data scan operations data flows through the selected arrangement of each test architecture 2006–2008 and through the LIR from SI 2004 to SO 2005. If testing or other operation, such as emulation, is to be performed on only one of the test architectures, say on test architecture 2007, the selected arrangements of other test architectures 2006 and 2008 must be serially traversed during the application of the test or other operation. The following description illustrates a modification to the test architectures 2006–2008 that prevents having to traverse arrangements within test architectures that are not involved in a test or other operation. This modification will be described as it would be applied if test architectures 2006–2008 are of the type 601 shown in FIG. 6A. To illustrate that test architectures 2006–2008 are of type 601, the SIs and SOs of test architectures 2006–2008 are each labeled as SI 604 and SO 605.

Figure 21:
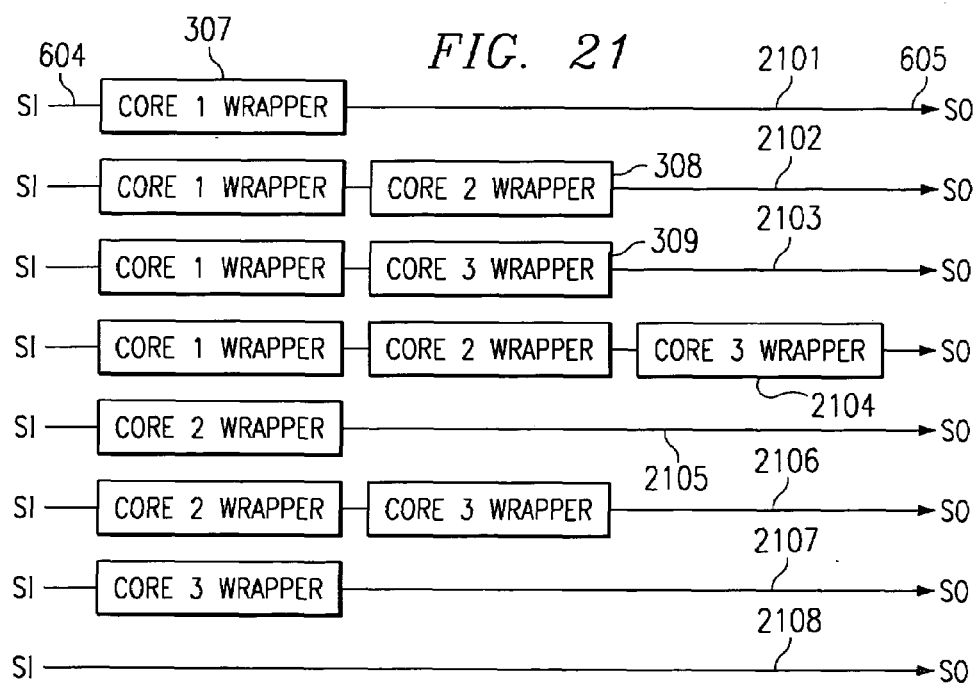
FIG. 21 illustrates a bypass arrangement for test architectures.

In FIG. 21, a group of arrangements 2101–2108 for the modified test architectures 601 are shown. In comparing the group of arrangements of FIG. 21 to that of FIG. 7, it is seen that arrangements 2101–2107 of FIG. 21 are identical to the arrangements 7001–7007 of FIG. 7. The difference between the FIGS. 7 and 21 arrangements is that a new wrapper bypass arrangement 2108 has been added in the arrangements of FIG. 21. This new wrapper bypass arrangement 2108 provides for directly connecting the SI 604 input and SO 605 output of modified test architectures 601, such that all wrappers 307–309 contained within the modified test architectures 601 may be disabled and disconnected (bypassed) from the serial path between SO 604 and SO 605.

Figure 22:
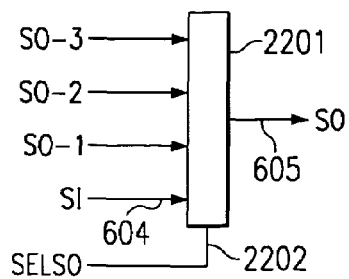
FIG. 22 illustrates example circuitry for enabling the FIG. 21 bypass arrangement.

FIG. 22 illustrates how the output linking circuitry 603 of FIG. 6C is modified to allow for the new wrapper bypass arrangement 2108. The modification involves replacing the three input multiplexer 611 of FIG. 6C with the four input multiplexer 2201 of FIG. 22 and connecting the SI 604 input of test architecture 601 to the fourth input of multiplexer 2201. In addition to this modification of the output linking circuitry 603, bypass codes for each of the test architectures 2006–2008 need to be added to the LIR 2002 to enable selecting the wrapper bypass arrangement 2108 of FIG. 21 in each of the test architectures 2006–2008. The following description of a bypass code for test architecture 2006 is given.

When the LIR 2002 contains a bypass code for test architecture 2006, it will output control on bus 2003 to input SELSO 2202 control to multiplexer 2201 to form the wrapper bypass arrangement 2108 between the SI 604 input and SO 605 output of test architecture 2006. Also when LIR 2002 contains the bypass code it will disable the wrappers 307–309 of test architecture 2006 from responding to control bus 109 by setting their Enable-1, 2, 3 inputs low via bus 2003. While test architecture 2006 is controlled to the wrapper bypass arrangement 2108, data passes directly from its SI 604 input to SO 605 output during instruction and data scan operations occurring in the serial test architecture configuration 2001 of FIG. 20.

If test architectures 2006 and 2008 are controlled to the above described wrapper bypass arrangement 2108 of FIG. 21 while test architecture 2007 is controlled to say the 2105 arrangement of FIG. 21, i.e. core 2 wrapper 308 is selected, then testing or other operations can occur on the wrapper of core 2 in test architecture 2007 without having to traverse wrapper arrangements in the leading 2006 and trailing 2008 test architectures of FIG. 20. Thus more efficient serial access is provided to the wrapper of core 2 of test architecture 2007 using the wrapper bypass arrangements 2108 in test architectures 2006 and 2008. This increase in serial access efficiency would be even more pronounced if the example of FIG. 20 had shown a multiplicity of serially connected test architectures preceding and following the target test architecture 2007.

While the modification to include a wrapper bypass arrangement 2108 has been described as it would apply to the type 601 test architecture of FIG. 6A, it is a general modification that can be applied to any of the test architectures described herein. For example, test architecture 1301 of FIG. 13, test architecture 1501 of FIG. 15, test architecture 1610 of FIG. 16, and test architecture 1810 of FIG. 18 could all be modified to include the wrapper bypass arrangement described above.

In test architectures that contain an embedded LIR, i.e. test architectures 1501, 1610, and 1810, the embedded LIR would include the above described wrapper bypass codes required to select the wrapper bypass arrangement 2108 of the test architecture. Including the wrapper bypass arrangement in all the above-mentioned test architectures would serve to improve the serial access efficiency when the test architectures are placed into a serial configuration 2001 as shown in FIG. 20.

In test architectures that contain an embedded LIR (i.e. 1501, 1610, 1810), it is preferable to use the LIR 1901 of FIG. 19 as opposed to LIR 801 of FIG. 8A, since LIR 1901 allows registering the data transfers during data scan operations. By registering data scan operation transfers, any number of serially connected test architectures may be placed in the wrapper bypass arrangement 2108 and operated without having to reduce the data scan clock frequency, as described in regard to FIG. 19. In test architectures that do not contain an embedded LIR (i.e. 601), it may be necessary to insert a data resynchronization circuit (DRC) at points along the serial path connecting multiple test architectures to maintain a desired scan clock rate through the serial path when multiple test architectures are placed in the wrapper bypass arrangement 2108.

Figure 23:
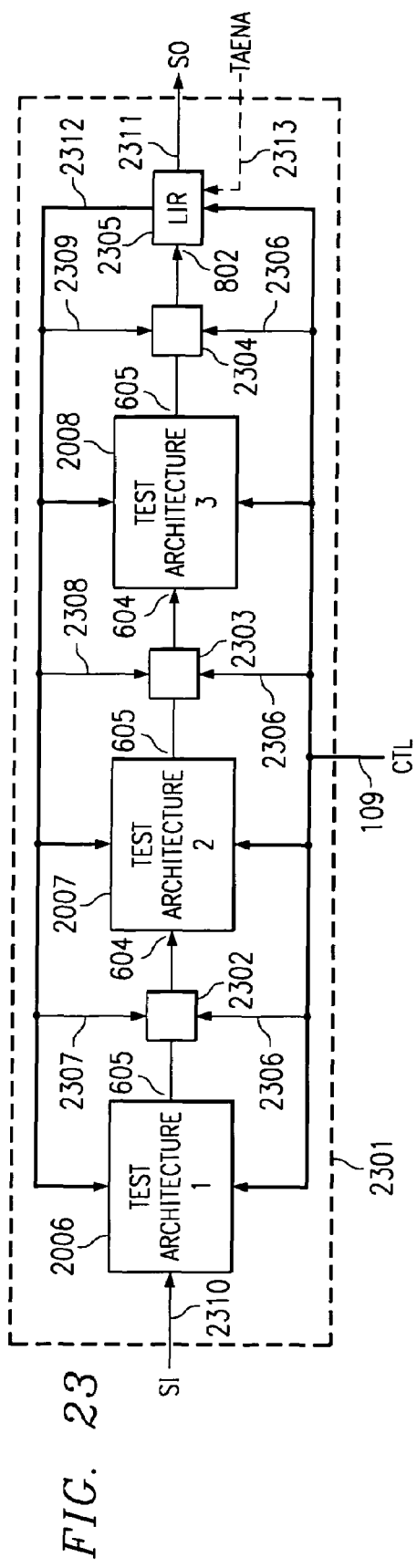
FIG. 23 illustrates the use of data resynchronization circuits in the serial path between test architectures according to the disclosure.

For example, FIG. 23 illustrates the serial connection 2301 of the multiple test architectures 2006–2008 of FIG. 20 being connected together serially through DRC's 2302–2304. TAENA 2313 is shown simply to indicate that serial configuration 2301, like serial configuration 2001, may be viewed as an embedded test architecture. As seen in FIG. 23, DRC 2302 exists between SO 605 of test architecture 2006 and the SI 604 of test architecture 2007, DRC 2303 exists between SO 605 of test architecture 2007 and SI 604 of test architecture 2008, and DRC 2304 exists between SO 605 of test architecture 2008 and the SI 802 of LIR 2305. The DRCs 2302–2304 are connected to the clock 2306 signal of control bus 109, to allow them to operate during both instruction and data scan operations. The DRCs 2302–2304 are also connected to bypass select signals 2307–2309, respectively, from LIR output control bus 2312. The bypass select signals are signals added to the LIR output control bus 2312 when DRCs are used. There is one unique bypass select signal 2307–2308 for each DRC 2302–2304 to allow separate control of each DRC.

Figure 24:
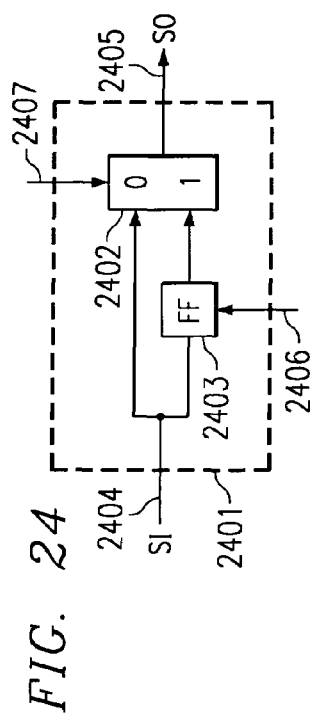
FIG. 24 illustrate an example circuit for the FIG. 23 data resynchronization circuits.

FIG. 24 illustrates an example DRC circuit. The DRC contains a flip-flop (FF) 2403 and a multiplexer 2402. The DRC has a SI 2404 that is input to the multiplexer and FF. The output of the FF is input to the multiplexer. The multiplexer has a control input 2407 and a SO 2405. The FF has a clock input 2406. The control inputs 2407 of DRC 2302–2304 of FIG. 24 are connected to the bypass select signals 2307–2309 respectively. The clock inputs 2406 of DRCs 2302–2304 of FIG. 24 are connected to control bus 109 clock signal 2306. The SIs 2404 of DRCs 2302–2304 of FIG. 24 are connected to the SOs 605 of test architectures 2006–2007 respectively. The SOs 2405 of DRCs 2302–2304 of FIG. 24 are connected to the SI 604 of test architecture 2007, the SI 604 of test architecture 2008, and SI 802 of LIR 2305 respectively.

If LIR 2305 is loaded with a bypass code for test architecture 2006, the bypass select signal 2307 will be set cause DRC 2302 to place FF 2406 between the SO output of test architecture 2006 and SI input of test architecture 2007. For all other codes, bypass select will be set to cause DRC 2302 to directly connect the SO output of test architecture 2006 to the SI input of test architecture 2007 via multiplexer 2402.

If LIR 2305 is loaded with a bypass code for test architecture 2007, the bypass select signal 2308 will be set cause DRC 2303 to place a FF 2406 between the SO output of test architecture 2007 and SI input of test architecture 2008. For all other codes, bypass select will be set to cause DRC 2303 to directly connect the SO output of test architecture 2007 to the SI input of test architecture 2008 via multiplexer 2402.

If LIR 2305 is loaded with a bypass code for test architecture 2008, the bypass select signal 2309 will be set cause DRC 2304 to place a FF 2406 between the SO output of test architecture 2008 and SI input of LIR 2305. For all other codes, bypass select will be set to cause DRC 2304 to directly connect the SO output of test architecture 2008 to the SI input of LIR 2305 via multiplexer 2402.

As can be seen from the above description of FIGS. 23 and 24, when a test architecture is placed in the wrapper bypass arrangement, the DRC associated with the SO output of the test architecture is set to insert FF 2406 between its SI 2404 and SO 2405. During instruction and data scan operations, this inserted FF 2406 registers the data output from the test architecture in the wrapper bypass arrangement to the SI input of the next serially connected test architecture.

Also as can be seen from the above description of FIGS. 23 and 24, when a test architecture is not placed in the wrapper bypass arrangement, the DRC associated with the SO output of the test architecture is set to form a direct path between its SI 2404 and SO 2405. During instruction and data scan operations, this direct path simply passes the data from the SO output of the leading test architecture to the SI input of the trailing test architecture. Directly connecting the SO output of a test architecture not in the wrapper bypass arrangement is fine since all other selectable arrangement will include registration in the form of one of the data registers 106–108 described in regard to FIG. 1.

While insertion of DRC FFs 2406 and/or LIR FFs 1904 in the serial path of series connected test architectures, such as FIG. 23, takes away from the test pattern reuse advantage 3 stated earlier in regard to FIGS. 8 and 9, it offers the advantage of being able to operate serially connected test architectures at high clock frequencies. Thus while test patterns may need to be modified when FF 2406/1904 bit positions are inserted in the path between serially connected test architectures, the inserted bit positions facilitate high speed clocking of the data through serially connected test architectures.

While DRCs in FIGS. 23 and 24 have been described as they would be used to register or pass serial test/emulation data between test architecture circuits 2007–2008, it should be understood that the DRCs could also be used to register or pass functional data between functional circuits as well. For example, circuits 2006–2007 could represent functional circuits in an IC or on a board, such as microprocessors, digital signal processors, memories, mixed signal circuits (A/D, D/A), or any other type of circuits that are connectable via their inputs and outputs to communicate data. Using DRCs, the data communicated between functional circuits could selectively be communicated in either a registered or non-registered form, as described above in regard to FIGS. 23 and 24.

Although the present disclosure has been described in accordance to the embodiments shown in the figures, one of ordinary skill in the art will recognize there could be variations to these embodiments and those variations should be within the spirit and scope of the present disclosure. Accordingly, modifications may be made by one ordinarily skilled in the art without departing from the spirit and scope of the appended claims.

What is claimed is:

1. An integrated circuit comprising:
   A. a wrapper serial input, a wrapper serial output, and wrapper control inputs including a clock input, a shift input, a capture input, an update input, and a reset input;
   B. input circuitry having a serial input coupled to the wrapper serial input, select serial outputs selectively coupled to the wrapper serial input, and link control inputs;
   C. output circuitry having a serial output coupled to the wrapper serial output, select serial inputs selectively coupled to the serial output, and link control inputs;
   D. a link instruction circuit having a serial input and a serial output coupled in series with the wrapper serial input and the wrapper serial output, control inputs connected to the wrapper control inputs, link control outputs connected to the link control inputs, a first enable output, a second enable output, and an embedded enable output, and an instruction register connected to the serial input, the link control outputs, the enable outputs, and selectively coupled to the serial output;
   E. a first IP core having a first wrapper, the first wrapper having a serial input connected to a select serial output, a serial output connected to a select serial input, a first enable input connected to the first enable output, and control inputs connected to the wrapper control inputs; and
   F. test architecture circuitry, including:
      i. embedded input circuitry having a serial input connected to a select serial output, embedded select serial outputs selectively coupled to the select serial output, and link control inputs connected to the link control outputs;
      ii. embedded output circuitry having a serial output connected to a select serial input, embedded select serial inputs selectively coupled to the select serial input, and link control inputs connected to the link control outputs;
      iii. a second IP core having a second wrapper, the second wrapper having a serial input connected to an embedded select serial output, a serial output connected to an embedded select serial input, a second enable input connected to the second enable output, and control inputs connected to the wrapper control inputs, and
      iv. a first embedded IP core embedded within the second IP core, the first embedded IP core having an embedded wrapper, the embedded wrapper having a serial input connected to an embedded select serial output, a serial output connected to an embedded select serial input, an embedded enable input connected to the embedded enable output, and control inputs connected to the wrapper control inputs.

2. The integrated circuit of claim 1 in which the integrated circuit is formed on a semiconductor substrate.

3. The integrated circuit of claim 1 in which the instruction register includes a shift register selectively connected in series between the serial input and the serial output of the link instruction circuit.

4. The integrated circuit of claim 1 in which the instruction register includes a shift register, an update register, and decode logic.

5. The integrated circuit of claim 1 in which the instruction register has a serial input connected to the serial input of the link instruction circuit and a serial output selectively connected to the serial output of the link instruction circuit by a multiplexer.

6. The integrated circuit of claim 1 in which the link instruction circuit includes a logic gate selectively controlling at least some of the control inputs in response to a select signal.

7. The integrated circuit of claim 1 in which the link instruction circuit includes a logic gate selectively controlling the control inputs, except for a reset signal on a reset input, in response to a select signal.

8. The integrated circuit of claim 1 in which the link instruction circuit is between the output circuitry and the wrapper serial output.

* * * * *